(12) United States Patent
Cai et al.

(10) Patent No.: US 11,985,874 B2
(45) Date of Patent: May 14, 2024

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Jianchang Cai, Beijing (CN); Lili Du, Beijing (CN); Binyan Wang, Beijing (CN); Yuanyou Qiu, Beijing (CN); Yudiao Cheng, Beijing (CN); Guobo Yang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 457 days.

(21) Appl. No.: 17/599,258

(22) PCT Filed: Apr. 15, 2021

(86) PCT No.: PCT/CN2021/087457
§ 371 (c)(1),
(2) Date: Sep. 28, 2021

(87) PCT Pub. No.: WO2021/238484
PCT Pub. Date: Dec. 2, 2021

(65) Prior Publication Data
US 2022/0320251 A1 Oct. 6, 2022

(30) Foreign Application Priority Data
May 29, 2020 (CN) .......................... 202010479767.2

(51) Int. Cl.
*H10K 59/131* (2023.01)
*H10K 59/121* (2023.01)
*H10K 59/65* (2023.01)

(52) U.S. Cl.
CPC ....... *H10K 59/131* (2023.02); *H10K 59/1213* (2023.02); *H10K 59/65* (2023.02)

(58) Field of Classification Search
CPC ... H10K 59/131; H10K 59/65; H10K 59/1213
See application file for complete search history.

(56) References Cited

U.S. PATENT DOCUMENTS 10,559,253 B1 2/2020 Li et al.
10,580,848 B1 3/2020 Ma et al.
(Continued)

FOREIGN PATENT DOCUMENTS

CN 107037926 A * 8/2017 ......... G06F 3/03542
CN 107994060 A 5/2018
(Continued)

OTHER PUBLICATIONS

Extended European Search Report in European Application No. 21773274.2 dated Oct. 7, 2022.
(Continued)

*Primary Examiner* — Mohammad M Choudhry
(74) *Attorney, Agent, or Firm* — Collard & Roe, P.C.

(57) ABSTRACT

A display substrate and a display device are provided. The first display region includes a first light-emitting element, and allows light from the first side to be at least partially transmitted to the second side. The first winding portion of the first signal line extends along a curve, the first winding portion, the first bending portion, and the first connecting portion are located in the second display region. The first signal line is configured to transmit a first driving signal to the first pixel circuit to drive the first light-emitting element (Continued)

to emit light. The second signal line is configured to transmit a second driving signal to the second pixel circuit and the third pixel circuit to drive the second light-emitting element and the third light-emitting element to emit light. The third signal line is floating, and is in the second display region and extends along the first direction.

20 Claims, 10 Drawing Sheets

(56) References Cited

U.S. PATENT DOCUMENTS

| | | | | |
|---|---|---|---|---|
| 2011/0278576 A1* | 11/2011 | Guo | ...................... | H01L 27/124 |
| | | | | 257/E21.409 |
| 2017/0116929 A1 | 4/2017 | Hirakata | | |
| 2018/0308442 A1* | 10/2018 | Hao | ...................... | G09G 3/2003 |
| 2019/0237487 A1 | 8/2019 | Zhang et al. | | |
| 2020/0052048 A1 | 2/2020 | Kuo et al. | | |
| 2020/0081583 A1* | 3/2020 | Na | ...................... | H10K 59/131 |
| 2020/0211477 A1* | 7/2020 | Lai | ...................... | G09G 3/3258 |

FOREIGN PATENT DOCUMENTS

| | | | | | |
|---|---|---|---|---|---|
| CN | 108010449 A | * | 5/2018 | ............ | G09F 9/302 |
| CN | 108732841 A | | 11/2018 | | |
| CN | 109037298 A | | 12/2018 | | |
| CN | 109285466 A | | 1/2019 | | |
| CN | 109300953 A | | 2/2019 | | |
| CN | 109541865 A | | 3/2019 | | |
| CN | 109560089 A | | 4/2019 | | |
| CN | 110323257 A | | 10/2019 | | |
| CN | 110444125 A | | 11/2019 | | |
| CN | 110649080 A | * | 1/2020 | ........... | G09G 3/3225 |
| CN | 110649080 A | | 1/2020 | | |
| CN | 110767717 A | | 2/2020 | | |
| CN | 110854178 A | * | 2/2020 | ......... | H01L 27/3244 |
| CN | 110874990 A | | 3/2020 | | |
| CN | 110992884 A | * | 4/2020 | ............ | G09G 3/006 |
| CN | 111180494 A | | 5/2020 | | |
| CN | 111384132 A | * | 7/2020 | ........... | H01L 27/3211 |
| CN | 114937410 A | * | 8/2022 | ............ | G09F 9/302 |

OTHER PUBLICATIONS

International Search Report of PCT/CN2021/087457 in Chinese, dated Jul. 7, 2021 with English translation.

Notice of Transmittal of the International Search Report of PCT/CN2021/087457 in Chinese, dated Jul. 7, 2021.

Written Opinion of the International Searching Authority of PCT/CN2021/087457 in Chinese, dated Jul. 7, 2021.

* cited by examiner

DISPLAY SUBSTRATE AND DISPLAY DEVICE

CROSS REFERENCE TO RELATED APPLICATIONS

This application is the National Stage of PCT/CN2021/087457 filed on Apr. 15, 2021, which claims priority under 35 U.S.C. § 119 of Chinese Application No. 202010479767.2 filed on May 29, 2020, the disclosure of which is incorporated by reference.

TECHNICAL FIELD

Embodiments of the present disclosure relate to a display substrate and a display device.

BACKGROUND

Organic light-emitting diode (OLED) display devices have characteristics such as wide viewing angle, high contrast, fast response speed, wide color gamut, high screen-to-body ratio, self-luminescence, lightness and thinness, and the like. Due to the above-described characteristics and advantages, the OLED display devices gradually receive widespread attention and can be applied to devices having a display function, such as mobile phones, monitors, laptops, smart watches, digital cameras, instruments and meters, flexible wearable devices, etc. With further development of the display technology, display devices having a high screen-to-body ratio can no longer meet people' needs, and display devices having a full screen have become a development trend of the future display technology.

SUMMARY

At least one embodiment of the present disclosure provides a display substrate, and the display substrate has a first side for display and a second side opposite to the first side, and comprises a display region. The display region comprises a first display region, a second display region, and a third display region, the second display region at least partially surrounds the first display region, the third display region at least partially surrounds the second display region, and the first display region, the second display region, and the third display region do not overlap with each other; the first display region comprises at least one first light-emitting element, and the first display region allows light from the first side to be at least partially transmitted to the second side; the second display region comprises at least one first pixel circuit, at least one second light-emitting element, and at least one second pixel circuit, the first light-emitting element is electrically connected with the first pixel circuit, and the second light-emitting element is electrically connected with the second pixel circuit; the third display region comprises at least one third light-emitting element and at least one third pixel circuit, and the third light-emitting element is electrically connected with the third pixel circuit; the display substrate is provided with at least one first signal line, at least one second signal line, and at least one third signal line; the first signal line comprises a first main body portion, a first winding portion, a first bending portion, and a first connecting portion that are connected in sequence; the first main body portion and the first connecting portion both extend along a first direction, a dummy extension line of the first main body portion along the first direction does not overlap with a dummy extension line of the first connecting portion along the first direction, and the first winding portion extends along a curve; the first winding portion, the first bending portion, and the first connecting portion are all in the second display region, the first main body portion is at least partially in the second display region, and the dummy extension line of the first main body portion along the first direction passes through the first display region; the first connecting portion is electrically connected with the first pixel circuit, the first signal line is configured to transmit a first driving signal to the first pixel circuit, so that the first pixel circuit drives the first light-emitting element to emit light; the second signal line extends along the first direction and comprises a first portion and a second portion, the first portion is in the third display region, and the second portion is in the second display region; the first portion is electrically connected with the third pixel circuit, the second portion is electrically connected with the second pixel circuit, the second signal line is configured to transmit a second driving signal to the second pixel circuit and the third pixel circuit, so that the second pixel circuit drives the second light-emitting element to emit light and the third pixel circuit drives the third light-emitting element to emit light; and the third signal line is in the second display region and extends along the first direction, and the third signal line is floating.

For example, the display substrate provided by an embodiment of the present disclosure further comprises at least one fourth signal line. The fourth signal line is in the third display region and extends along the first direction, the fourth signal line is electrically connected with the third pixel circuit, and the fourth signal line is configured to transmit a third driving signal to the third pixel circuit, so that the third pixel circuit drives the third light-emitting element to emit light; and the third signal line and the fourth signal line are located on a same extension line, and there is a gap between the third signal line and the fourth signal line, so that the third signal line and the fourth signal line are insulated from each other.

For example, in the display substrate provided by an embodiment of the present disclosure, the extension line is a straight line.

For example, in the display substrate provided by an embodiment of the present disclosure, the first main body portion of the first signal line comprises a first sub-portion and a second sub-portion, the first sub-portion is in the third display region, and the second sub-portion is in the second display region; the first sub-portion is electrically connected with the third pixel circuit, and the second sub-portion is electrically connected with the second pixel circuit; and the first signal line is further configured to transmit the first driving signal to the second pixel circuit and the third pixel circuit, so that the second pixel circuit drives the second light-emitting element to emit light and the third pixel circuit drives the third light-emitting element to emit light.

For example, in the display substrate provided by an embodiment of the present disclosure, the at least one second pixel circuit comprises a plurality of second pixel circuits, and the plurality of second pixel circuits are arranged in a plurality of columns along the first direction; and second pixel circuits connected with the first signal line and second pixel circuits connected with the second signal line are located in different columns.

For example, in the display substrate provided by an embodiment of the present disclosure, the at least one third pixel circuit comprises a plurality of third pixel circuits, and the plurality of third pixel circuits are arranged in a plurality of columns along the first direction; and third pixel circuits connected with the first signal line, third pixel circuits connected with the second signal line, and third pixel circuits connected with the fourth signal line are located in different columns.

For example, in the display substrate provided by an embodiment of the present disclosure, the first winding portion has a distance from an edge of the first display region, and the first winding portion extends along an extension direction of the edge of the first display region.

For example, in the display substrate provided by an embodiment of the present disclosure, a shape of the first display region is a circle or an ellipse, and the first winding portion extends along an arc.

For example, in the display substrate provided by an embodiment of the present disclosure, the at least one second signal line comprises a plurality of second signal lines, the at least one third signal line comprises a plurality of third signal lines, and the plurality of second signal lines and the plurality of third signal lines are arranged at intervals.

For example, in the display substrate provided by an embodiment of the present disclosure, the at least one second signal line comprises a plurality of second signal lines, the at least one first signal line comprises a plurality of first signal lines, and the plurality of second signal lines and first connecting portions of the plurality of first signal lines are arranged at intervals.

For example, in the display substrate provided by an embodiment of the present disclosure, the first driving signal, the second driving signal, and the third driving signal are different data signals or same data signals, and the data signals correspond to display gray scales.

For example, in the display substrate provided by an embodiment of the present disclosure, each of the first pixel circuit, the second pixel circuit, and the third pixel circuit comprises a switching thin film transistor, and the switching thin film transistor comprises a gate electrode, a first electrode and a second electrode; and the first signal line, the second signal line, or the fourth signal line is electrically connected with the first electrode or the second electrode of the switching thin film transistor.

For example, in the display substrate provided by an embodiment of the present disclosure, the first main body portion, the first winding portion, the first connecting portion, the second signal line, and the third signal line are in a same layer.

For example, the display substrate provided by an embodiment of the present disclosure further comprises a source-drain metal layer. The first electrode and the second electrode of the switching thin film transistor are in the source-drain metal layer, and the first main body portion, the first winding portion, the first connecting portion, the second signal line, and the third signal line are in the source-drain metal layer.

For example, in the display substrate provided by an embodiment of the present disclosure, the first bending portion and the first connecting portion are in different layers.

For example, the display substrate provided by an embodiment of the present disclosure further comprises a gate metal layer. The gate electrode of the switching thin film transistor is in the gate metal layer, and the first bending portion of at least one of the first signal lines is in the gate metal layer.

For example, the display substrate provided by an embodiment of the present disclosure further comprises a first metal layer. The first metal layer is a film layer different from the gate metal layer, and is insulated from the gate metal layer, the at least one first signal line comprises a plurality of first signal lines, first bending portions of part of the first signal lines are in the gate metal layer, and first bending portions of other part of the first signal lines are in the first metal layer.

For example, in the display substrate provided by an embodiment of the present disclosure, the first signal line, the second signal line, and the third signal line comprise a metal trace or a transparent conductive trace.

For example, in the display substrate provided by an embodiment of the present disclosure, the first light-emitting element, the second light-emitting element, and the third light-emitting element comprise an organic light-emitting diode.

For example, in the display substrate provided by an embodiment of the present disclosure, pixels per inch of second light-emitting elements in the second display region is less than pixels per inch of third light-emitting elements in the third display region.

At least one embodiment of the present disclosure further provides a display device, which comprises the display substrate provided by any one of the embodiments of the present disclosure.

For example, the display device provided by an embodiment of the present disclosure further comprises a sensor. The sensor is provided on the second side of the display substrate, and the sensor is configured to receive the light from the first side.

For example, in the display device provided by an embodiment of the present disclosure, an orthogonal projection of the sensor on the display substrate at least partially overlaps with the first display region.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
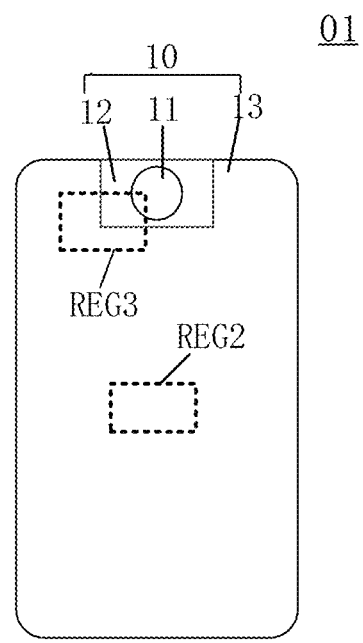
FIG. 1 is a schematic plane view of a display substrate provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With respect to current display substrates having under-screen sensors (e.g., cameras), in order to increase the light transmittance of the display region corresponding to the under-screen sensor (e.g., camera) of the display substrate, pixels per inch (PPI) of the light-emitting elements of the display region corresponding to the under-screen sensor (e.g., camera) may be less than PPI of the light-emitting elements of other display region of the display substrate.

However, because light-emitting elements in different regions on the display substrate are different in PPI, arrangement modes of the light-emitting elements and corresponding pixel circuits in different regions are different, which may generate different driving requirements and may reduce uniformity of the circuit environment, thereby affecting loaded signals. The traditional wiring mode is difficult to adapt to variety of different driving requirements, and is difficult to improve the circuit environment, and the traditional wiring mode may also affect light transmittance of the display region corresponding to the under-screen sensor (e.g., camera), which makes wiring design difficult and affects performance of the display device adopting the display substrate.

At least one embodiment of the present disclosure provides a display substrate and a display device. The display substrate can meet driving requirements of different display regions, and can balance the circuit environment, optimize wiring design, improve rationality of layout, and ensure normal display, which helps improve performance of full-screen display devices.

Hereinafter, the embodiments of the present disclosure will be explained in detail with reference to the accompanying drawings. It should be noted that, same reference signs in different drawings are used for denoting same elements that have been described.

FIG. 1 is a schematic plane view of a display substrate provided by at least one embodiment of the present disclosure. As shown in FIG. 1, a display substrate 01 includes a display region 10; and the display region 10 includes a first display region 11, a second display region 12 and a third display region 13. For example, the first display region 11, the second display region 12 and the third display region 13 do not overlap with each other. For example, the third display region 13 at least partially surrounds (e.g., partially surrounds) the second display region 12, and the second display region 12 at least partially surrounds (e.g., completely surrounds) the first display region 11. It should be noted that, in some examples, the display substrate 01 may further include a peripheral region; and the peripheral region at least partially surrounds the third display region 13.

For example, the display substrate 01 has a first side for display and a second side opposite to the first side. For example, in some examples, as shown in FIG. 1, the first side is a front side of the display substrate 01 (i.e., the plane shown in FIG. 1); and the second side is a back side of the display substrate. For example, a sensor may be provided in the position on the second side of the display substrate 01 that corresponds to the first display region 11; and the sensor may be, for example, an image sensor or an infrared sensor, etc. The sensor is configured to receive light from the first side of the display substrate 01, so that operations such as image shooting, distance sensing, light intensity sensing and the like may be performed.

Figure 2:
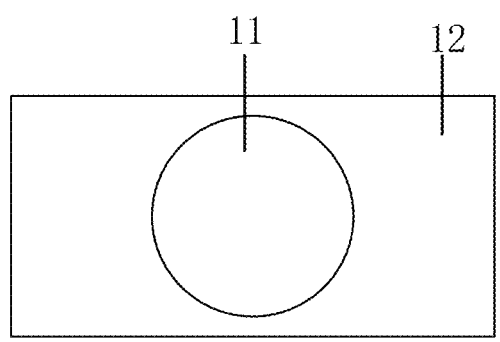
FIG. 2 is a schematic plane view of a first display region and a second display region of the display substrate shown in FIG. 1.

FIG. 2 is a schematic plane view of the first display region and the second display region of the display substrate shown in FIG. 1. For example, as shown in FIG. 1 and FIG. 2, the second display region 12 at least partially surrounds (e.g., completely surrounds) the first display region 11.

For example, a shape of the first display region 11 may be a circle or an ellipse; and a shape of the second display region 12 may be a rectangle, but the embodiments of the present disclosure are not limited thereto. For another example, the shapes of the first display region 11 and the second display region 12 may both be rectangles or other suitable shapes.

Figure 3:
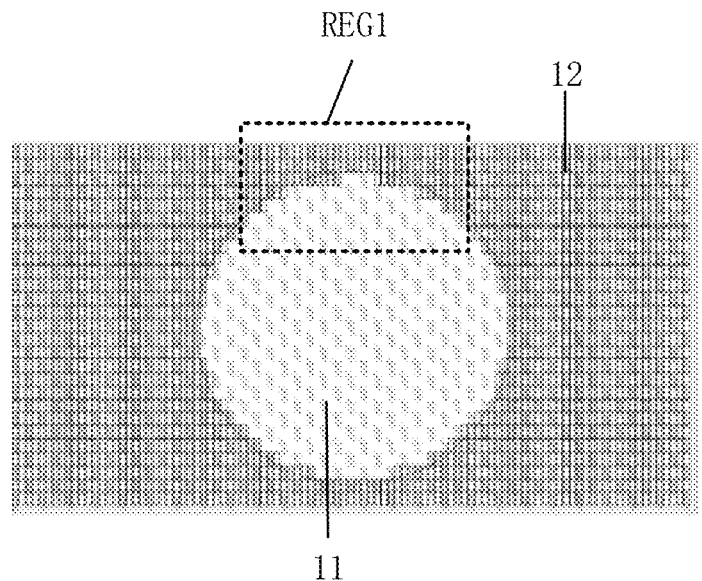
FIG. 3 is an example of the first display region and the second display region of the display substrate shown in FIG. 2.
Figure 4:
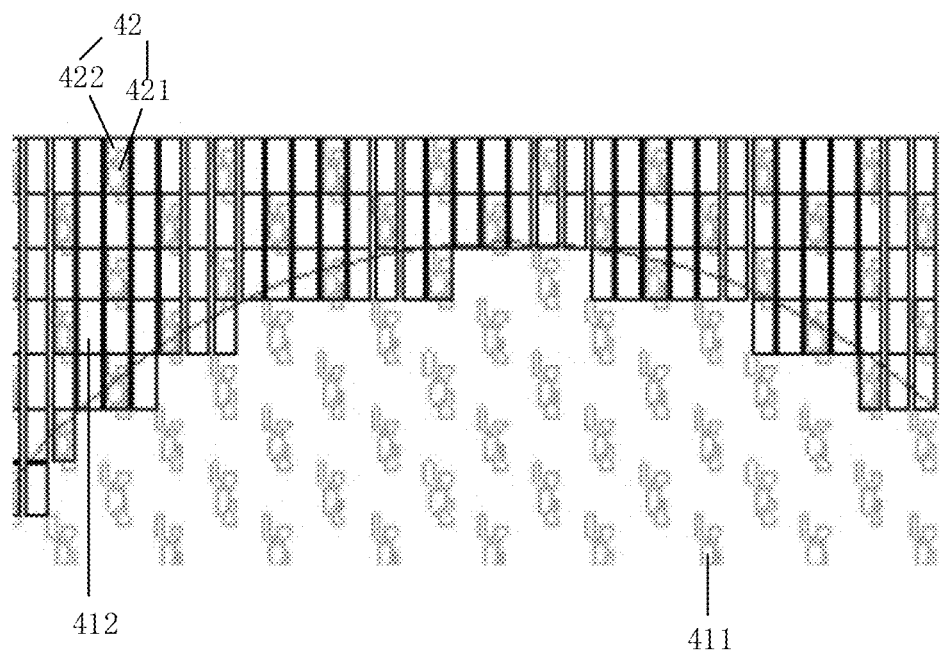
FIG. 4 is an enlarged view of a partial region of FIG. 3.
Figure 5:
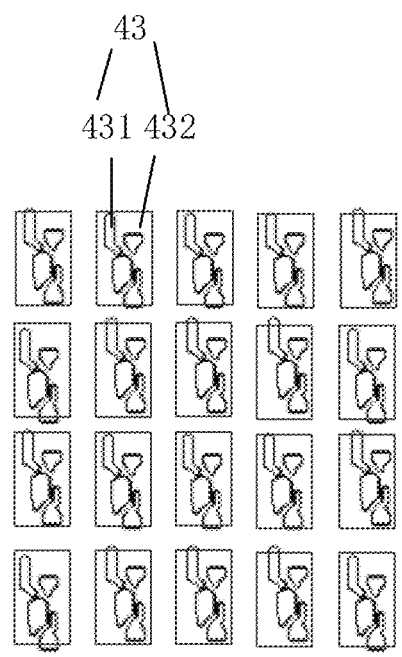
FIG. 5 is an enlarged view of a partial region of a third display region of the display substrate shown in FIG. 1.

FIG. 3 is an example of the first display region and the second display region of the display substrate shown in FIG. 2. FIG. 4 is an enlarged view of a partial region REG1 of FIG. 3, and FIG. 5 is an enlarged view of a partial region REG2 of the third display region 13 of the display substrate shown in FIG. 1.

For example, as shown in FIG. 3 and FIG. 4, the first display region 11 includes at least one (e.g., a plurality of) first light-emitting elements 411. It should be noted that, for clarity, the related drawings use an anode structure of the first light-emitting element 411 to schematically represent the first light-emitting element 411. For example, the first display region 11 includes a plurality of first light-emitting elements 411 arranged in an array; and the first light-emitting elements 411 are configured to emit light. For example, there is no pixel circuit in the first display region 11; and the pixel circuit for driving the first light-emitting element 411 is provided in the second display region 12, so as to reduce a metal coverage area of the first display region 11 and increase light transmittance of the first display region 11. The pixel circuit for driving the first light-emitting element 411 will be described below, and no details will be repeated here.

For example, the plurality of first light-emitting elements 411 may be arranged in a plurality of light-emitting units; and these light-emitting units are arranged in an array. For example, each light-emitting unit may include one or more first light-emitting elements 411. For example, the plurality of first light-emitting elements 411 may emit light of a same color or may emit light of different colors, for example, may emit white light, red light, blue light, green light, etc., which may be determined according to actual needs, and is not limited in the embodiments of the present disclosure. For example, for the arrangement mode of the plurality of first light-emitting elements 411, the conventional arrangement mode of pixel units may be referred to, for example, GGRB, RGBG, RGB, etc., which may not be limited in the embodiments of the present disclosure.

For example, the first display region 11 allows light from the first side of the display substrate 01 to be at least partially transmitted to the second side of the display substrate 01. In this way, it is convenient to provide a sensor in the position, on the second side of the display substrate 01, corresponding to the first display region 11; and the sensor may receive light from the first side, so that operations such as image shooting, distance sensing, light intensity sensing and the like may be performed.

For example, as shown in FIG. 3 and FIG. 4, the second display region 12 includes at least one (e.g., a plurality of) first pixel circuit(s) 412. For example, the first light-emitting elements 411 are electrically connected with the first pixel circuits 412 in one-to-one correspondence; and the plurality of first pixel circuits 412 are used to drive the plurality of first light-emitting elements 411 in one-to-one correspondence. For example, the rectangular box shown in FIG. 3 and FIG. 4 (a black-frame white-filled region indicated by reference sign 412) represents a first pixel driving unit; and each first pixel driving unit includes a first pixel circuit 412. For example, the first pixel circuits 412 are configured to drive the plurality of first light-emitting elements 411 to emit light in one-to-one correspondence. That is, one first pixel circuit 412 drives one corresponding first light-emitting element 411; and different first pixel circuits 412 drive different first light-emitting elements 411.

It should be noted that, in FIG. 3 and FIG. 4, not all rectangular boxes represent the first pixel driving unit; when distribution density of the first pixel circuits 412 and the first light-emitting elements 411 changes (e.g., the distribution density decreases), it is possible that only some of the rectangular boxes represent the first pixel driving unit, and the other of the rectangular boxes are no longer provided therein with the first pixel driving unit.

It should be noted that, in FIG. 3 and FIG. 4, the first pixel driving unit may include one or more first pixel circuits 412. When the light-emitting unit in the first display region 11 includes one first light-emitting element 411, the first pixel driving unit also includes one first pixel circuit 412. When the light-emitting unit in the first display region 11 includes a plurality of first light-emitting elements 411, the first pixel driving unit also includes a plurality of first pixel circuits 412. The amount of the first light-emitting elements 411 in each light-emitting unit is, for example, equal to the amount of the first pixel circuits 412 in each first pixel driving unit, thereby implementing driving in one-to-one correspondence.

For example, the plurality of first light-emitting elements 411 are arranged in an array; and the plurality of first pixel circuits 412 are also arranged in an array. Here, "being arranged in an array" may refer to a plurality of devices constituting a group and a plurality of groups of devices being arranged in an array; or may also refer to the plurality of devices themselves being arranged in an array, which is not limited in the embodiments of the present disclosure. For example, in some examples, as shown in FIG. 3 and FIG. 4, every 4 first light-emitting elements 411 constitute a group; and a plurality of groups of first light-emitting elements 411 are arranged in an array. Accordingly, every 4 first pixel circuits 412 constitute a group; and a plurality of groups of first pixel circuits 412 are arranged in an array. In this case, each first pixel driving unit includes 4 first pixel circuits 412.

For example, as shown in FIG. 3 and FIG. 4, the second display region 12 further includes at least one (e.g., a plurality of) second light-emitting element(s) 421 and at least one (e.g., a plurality of) second pixel circuit(s) 422. The second light-emitting elements 421 are electrically connected with the second pixel circuits 422 in one-to-one correspondence; and the second pixel circuit 422 is configured to drive the second light-emitting element 421 to emit light. It should be noted that, the rectangular box indicated by reference sign 422 in FIG. 4 is only used to show an approximate position of the second pixel circuit 422, and does not indicate the specific shape of the second pixel circuit 422 and the specific boundary of the second pixel circuit 422. For example, a plurality of second light-emitting elements 421 are arranged in an array; and a plurality of second pixel circuits 422 are also arranged in an array. For example, at least one second light-emitting element 421 and a second pixel circuit 422 corresponding thereto constitute a second pixel driving unit 42.

It should be noted that, in FIG. 3 and FIG. 4, the second pixel driving unit 42 may include one second pixel circuit 422 and one second light-emitting element 421, or may include a plurality of second pixel circuits 422 and a plurality of second light-emitting elements 421. In the case where the second pixel driving unit 42 includes a plurality of second pixel circuits 422 and a plurality of second light-emitting elements 421, in each second pixel driving unit 42, the amount of the second pixel circuits 422 is, for example, equal to the amount of the second light-emitting elements 421, thereby implementing driving in one-to-one correspondence.

For example, a plurality of second light-emitting elements 421 are arranged in an array; and a plurality of second pixel circuits 422 are also arranged in an array. Here, "being arranged in an array" may refer to a plurality of devices constituting a group and a plurality of groups of devices being arranged in an array; or may also refer to a plurality of devices themselves being arranged in an array, which is not be limited in the embodiments of the present disclosure. For example, in some examples, as shown in FIG. 3 and FIG. 4, every 4 second light-emitting elements 421 constitute a group; and a plurality of groups of second light-emitting elements 421 are arranged in an array. Accordingly, every 4 second pixel circuits 422 constitute a group, and a plurality of groups of second pixel circuits 422 are arranged in an array. In this case, each second pixel driving unit 42 includes 4 second pixel circuits 422 and 4 second light-emitting elements 421.

For example, as shown in FIG. 5, the third display region 13 includes at least one (e.g., a plurality of) third light-emitting element(s) 431 and at least one (e.g., a plurality of) third pixel circuit(s) 432. The third light-emitting elements 431 are electrically connected with the third pixel circuits 432 in one-to-one correspondence; and the third pixel circuit 432 is used to drive the third light-emitting element 431 to emit light. It should be noted that, the rectangular box indicated by reference sign 432 in FIG. 5 is only used to show an approximate position of the third pixel circuit 432, and does not indicate the specific shape of the third pixel circuit 432 and the specific boundary of the third pixel circuit 432. For example, a plurality of third light-emitting elements 431 are arranged in an array; and a plurality of third pixel circuits 432 are also arranged in an array. For example, at least one third light-emitting element 431 and a third pixel circuit 432 corresponding thereto constitute one third pixel driving unit 43.

It should be noted that, in FIG. 5, the third pixel driving unit 43 may include one third pixel circuit 432 and one third light-emitting element 431, or may include a plurality of third pixel circuits 432 and a plurality of third light-emitting elements 431. In the case where the third pixel driving unit 43 includes a plurality of third pixel circuits 432 and a plurality of third light-emitting elements 431, in each third pixel driving unit 43, the amount of the third pixel circuits 432 is, for example, equal to the amount of the third light-emitting elements 431, thereby implementing driving in one-to-one correspondence.

For example, the plurality of third light-emitting elements 431 are arranged in an array; and the plurality of third pixel circuits 432 are also arranged in an array. Here, "being arranged in an array" may refer to a plurality of devices constitute a group and a plurality of groups of devices being arranged in an array; or may also refer to a plurality of devices themselves being arranged in an array, which is not limited in the embodiments of the present disclosure. For example, in some examples, as shown in FIG. 5, every 4 third light-emitting elements 431 constitute a group; and a plurality of groups of third light-emitting elements 431 are arranged in an array. Accordingly, every 4 third pixel circuits 432 constitute a group, and a plurality of groups of third pixel circuits 432 are arranged in an array. In this case, each third pixel driving unit 43 includes 4 third pixel circuits 432 and 4 third light-emitting elements 431.

For example, PPI of the plurality of first light-emitting elements 411 in the first display region 11 is less than PPI of the plurality of second light-emitting elements 421 in the second display region 12; and PPI of the plurality of second light-emitting elements 421 in the second display region 12 is less than PPI of the plurality of third light-emitting elements 431 in the third display region 13. For example, the first display region 11 and the second display region 12 may be referred to as a low-resolution region of the display substrate 01; and accordingly, the third display region 13 may be referred to as a high-resolution region of the display substrate 01. For example, the sum of pixel light-emission area of the second display region 12 and pixel light-emission area of the first display region 11 may be ⅛ to ½ of the pixel light-emission area of the third display region 13.

It should be noted that, in some examples, the PPI of the plurality of first light-emitting elements 411 in the first display region 11 may also be equal to the PPI of the plurality of second light-emitting elements 421 in the second display region 12, which may be determined according to actual needs, and is not limited in the embodiments of the present disclosure.

By sequentially increasing the PPI of the light-emitting elements in the first display region 11, the second display region 12, and the third display region 13, it may ensure the three display regions to emit light normally so as to display images, and at a same time, facilitate light on the first side of the display substrate 01 to pass through the first display region 11 to reach the second side, and further facilitate the sensor provided on the second side of the display substrate 01 to sense light.

Figure 6A:
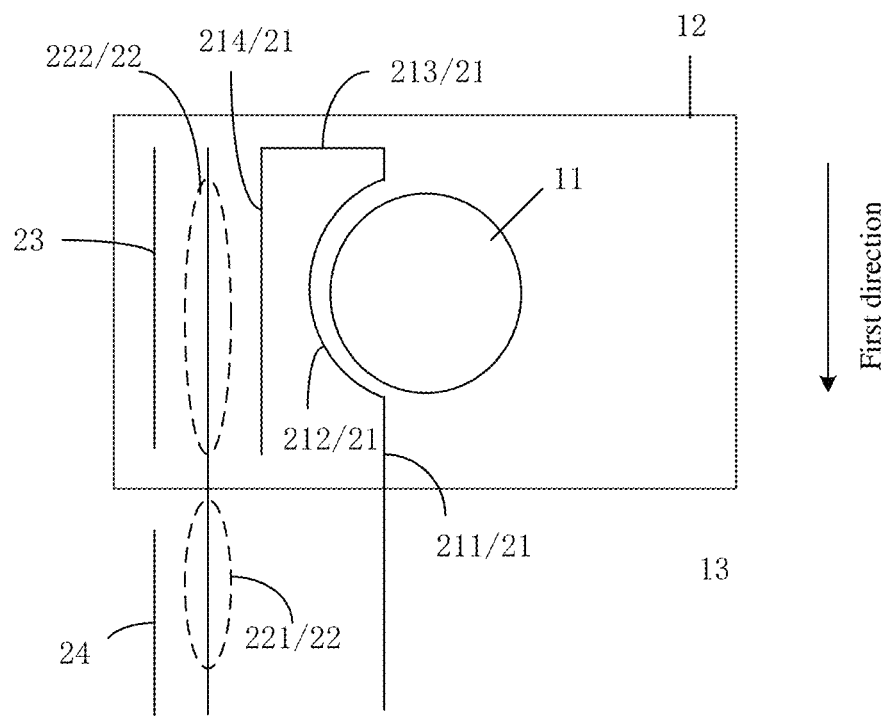
FIG. 6A is a schematic plane view I of a partial region of a display substrate provided by at least one embodiment of the present disclosure.
Figure 6B:
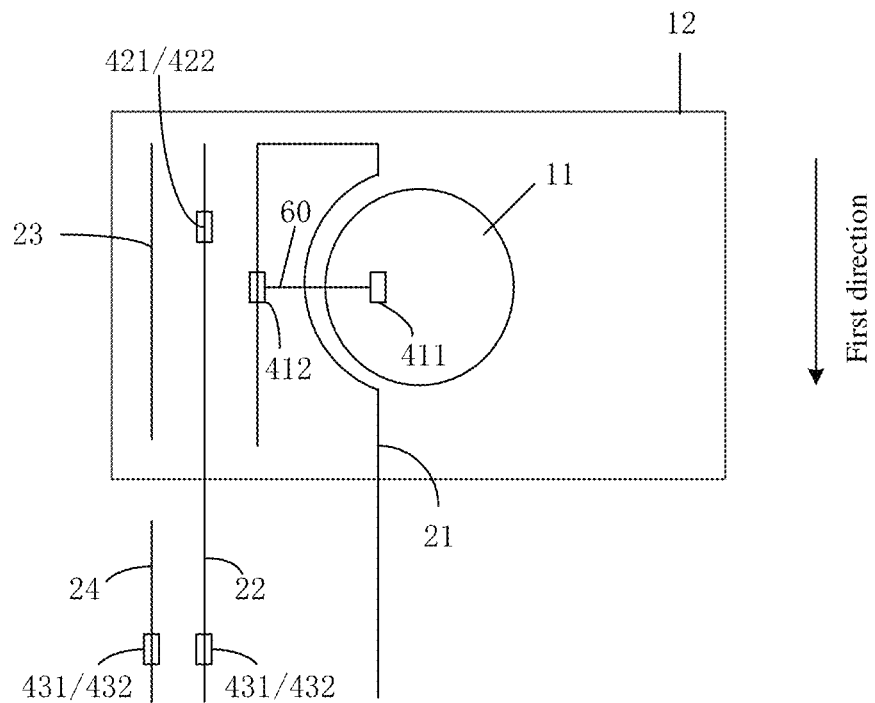
FIG. 6B is a schematic plane view II of a partial region of a display substrate provided by at least one embodiment of the present disclosure.
Figure 6C:
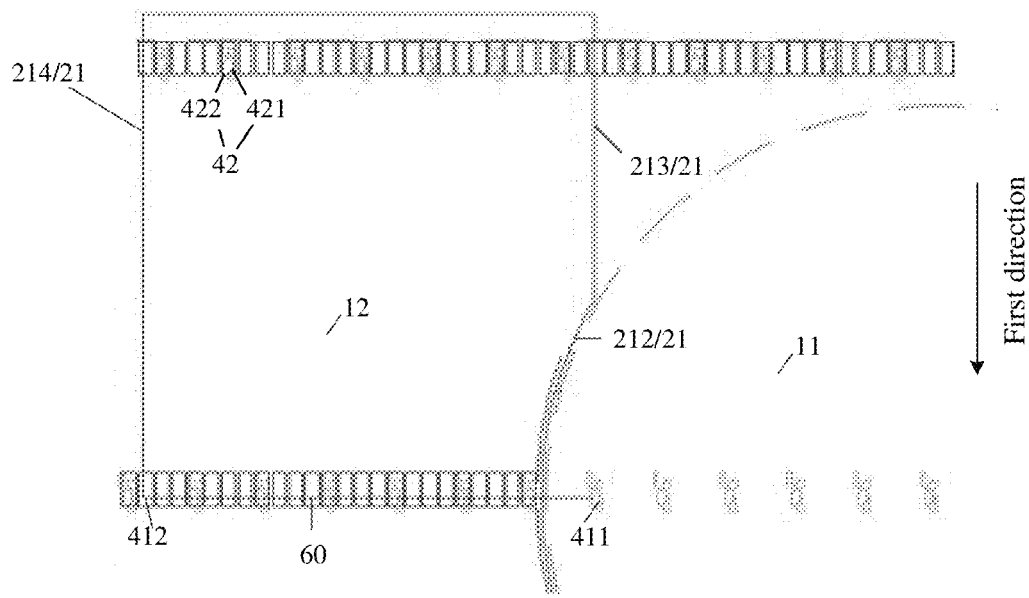
FIG. 6C is a schematic plane view III of a partial region of a display substrate provided by at least one embodiment of the present disclosure.

FIG. 6A is a schematic plane view I of a partial region of a display substrate provided by at least one embodiment of the present disclosure; FIG. 6B is a schematic plane view II of a partial region of a display substrate provided by at least one embodiment of the present disclosure; and FIG. 6C is a schematic plane view III of a partial region of a display substrate provided by at least one embodiment of the present disclosure. For example, as shown in FIG. 6A to FIG. 6C, the display substrate 01 is provided thereon with at least one first signal line 21, at least one second signal line 22, and at least one third signal line 23.

For example, as shown in FIG. 6A to FIG. 6C, the first signal line 21 includes a first main body portion 211, a first winding portion 212, a first bending portion 213, and a first connecting portion 214 that are connected in sequence. Both the first main body portion 211 and the first connecting portion 214 extend along a first direction; and the first direction is, for example, a column direction in which the foregoing plurality of pixel circuits or light-emitting elements are arranged in arrays. Of course, the embodiments of the present disclosure are not limited thereto, and the first direction may also have a certain included angle with the column direction, which may be determined according to actual needs.

For example, in some examples, both the first main body portion 211 and the first connecting portion 214 are straight lines extending along the first direction. For example, a dummy extension line of the first main body portion 211 along the first direction does not overlap with a dummy extension line of the first connecting portion 214 along the first direction, that is, the first main body portion 211 and the first connecting portion 214 are staggered from each other in a direction perpendicular to the first direction. Of course, the embodiments of the present disclosure are not limited thereto, and the first main body portion 211 and the first connecting portion 214 may also be a curve having a certain radian, and the curve substantially extends along the first direction.

For example, the first winding portion 212 extends along a curve. For example, the first winding portion 212 has a distance from an edge of the first display region 11; and the first winding portion 212 extends along an extension direction of the edge of the first display region 11. That is, the first winding portion 212 does not pass through the first display region 11; and the first winding portion 212 is distributed at least partially around the first display region 11. For example, in some examples, a shape of the first display region 11 is a circle or an ellipse. Accordingly, the first winding portion 212 extends along an arc, and a radian of the arc is less than or equal to π. For example, a separation distance between the first winding portion 212 and the edge of the first display region 11 may be set to any value, which is not limited in the embodiments of the present disclosure. The first bending portion 213 is, for example, composed of a plurality of folding lines for connecting the first winding portion 212 and the first connecting portion 214.

For example, the first winding portion 212, the first bending portion 213, and the first connecting portion 214 are all located in the second display region 12; the first main body portion 211 is at least partially located in the second display region 12; and a dummy extension line of the first main body portion 211 along the first direction passes through the first display region 11. For example, none of the first main body portion 211, the first winding portion 212, the first bending portion 213, and the first connecting portion 214 is located in the first display region 11, which, thus, may avoid affecting light transmittance of the first display region 11.

For example, the first connecting portion 214 is electrically connected with the first pixel circuit 412. The first signal line 21 is configured to transmit a first driving signal to the first pixel circuit 412, so that the first pixel circuit 412 drives the first light-emitting element 411 to emit light. For example, in some examples, the first pixel circuit 412 is electrically connected with the first light-emitting element 411 through a connecting line 60, so that the first light-emitting element 411 may be driven to emit light. For example, in some examples, the connecting line 60 may be provided in a same layer as an anode of the first light-emitting element 411, and formed integrally with the anode of the first light-emitting element 411. Of course, the embodiments of the present disclosure are not limited thereto, and any applicable mode may be adopted to electrically connect the first pixel circuit 412 and the first light-emitting element 411, which may be determined according to actual needs. For example, in some other examples, an ITO layer may be separately provided to form the connecting line 60; the ITO layer is, for example, located between a source-drain metal layer (SD layer) and an anode layer of the first light-emitting element 411, and makes the connecting line 60 to be respectively electrically connected with the first pixel circuit 412 and the first light-emitting element 411 through via holes.

For example, as shown in FIG. 6A to FIG. 6B, the second signal line 22 extends along the first direction and includes a first portion 221 and a second portion 222. The first portion 221 is located in the third display region 13; and the second portion 222 is located in the second display region 12. The first portion 221 is electrically connected with the third pixel circuit 432; and the second portion 222 is electrically connected with the second pixel circuit 422. The second signal line 22 is configured to transmit a second driving signal to the second pixel circuit 422 and the third pixel circuit 432, so that the second pixel circuit 422 drives the second light-emitting element 421 to emit light and the third pixel circuit 432 drives the third light-emitting element 431 to emit light.

It should be noted that, in the embodiments of the present disclosure, the second signal line 22 is electrically connected with both the second pixel circuit 422 and the third pixel circuit 432, but this does not mean that the second driving signal supplied to the second pixel circuit 42 is the same as the second driving signal supplied to the third pixel circuit 432. For example, progressive scanning or time-sharing scanning may be adopted, so that the second driving signal supplied to the second pixel circuit 422 is different from the second driving signal supplied to the third pixel circuit 432, so as to facilitate the corresponding second light-emitting element 421 and third light-emitting element 431 to respectively display required gray scales.

For example, as shown in FIG. 6A to FIG. 6B, the third signal line 23 is located in the second display region 12 and extends along the first direction; and the third signal line 23 is floating. For example, the third signal line 23 is a straight line extending along the first direction. For example, the third signal line 23 is a dummy line and is not electrically connected with any pixel circuit. Because the PPI of the plurality of second light-emitting elements 421 in the second display region 12 is less than the PPI of the plurality of third light-emitting elements 431 in the third display region 13, distribution density of signal lines supplying driving signals (e.g., data signals corresponding to display gray scales) in the second display region 12 is also less than distribution density thereof in the third display region 13. The signal line supplying the driving signal (e.g., the data signal corresponding to the display gray scale) usually extends along the first direction (column direction), so, by providing the third signal line 23 extending along the first direction in the second display region 12, the difference between the distribution density of the signal lines in the second display region 12 and the distribution density of the signal lines in the third display region 13 may be effectively reduced, the circuit environment in the second display region 12 may be effectively balanced, and etching uniformity may be improved.

In the embodiments of the present disclosure, the first signal line 21, the second signal line 22, and the third signal line 23 exist in the display region (e.g., the second display region 12) at the same time, and a variety of different wiring modes are provided, which, thus, may meet driving requirements of different display regions, for example, may meet the driving requirements of the first display region 11, the second display region 12, and the third display region 13 at the same time. In addition, by providing the third signal line 23 and allowing the third signal line 23 to extend along the first direction, the circuit environment may be effectively balanced. The display substrate 01 may optimize wiring design, improve rationality of layout, ensure normal display, and help improve performance of the full-screen display device. The display substrate 01 may also improve performance of a display device having an under-screen sensor.

For example, in some examples, as shown in FIG. 6A and FIG. 6B, the display substrate 01 further includes at least one fourth signal line 24. The fourth signal line 24 is located in the third display region 13 and extends along the first direction. For example, the fourth signal line 24 is a straight line extending along the first direction. For example, the fourth signal line 24 is electrically connected with the third pixel circuit 432; and the fourth signal line 24 is configured to transmit a third driving signal to the third pixel circuit 432, so that the third pixel circuit 432 drives the third light-emitting element 431 to emit light.

For example, the third signal line 23 and the fourth signal line 24 are located on a same extension line; and there is a gap between the third signal line 23 and the fourth signal line 24, so that the third signal line 23 and the fourth signal line 24 are insulated from each other. For example, the extension line is a straight line. For example, the third signal line 23 and the fourth signal line 24 may be regarded as two insulated portions formed after cutting off a same signal line. Thus, distribution density of the third signal lines 23 in the second display region 12 may be substantially equal to distribution density of the fourth signal lines 24 in the third display region 13, so that overall signal line distribution density of the second display region 12 is not much different from overall signal line distribution density of the third display region 13, which, thus, may effectively balance the circuit environment in the display region (e.g., the second display region 12 and the third display region 13). Moreover, the third signal line 23 and the fourth signal line 24 may be formed in a same process, thereby improving etching uniformity, simplifying the production process, improving production efficiency, and reducing production costs. For example, in some examples, a signal line running through the third display region 13 and the second display region 12 may be formed firstly, and then the signal line is cut off at a junction between the third display region 13 and the second display region 12, thereby forming the third signal line 23 and the fourth signal line 24, so as to be compatible with the usual panel fabrication process.

Figure 7:
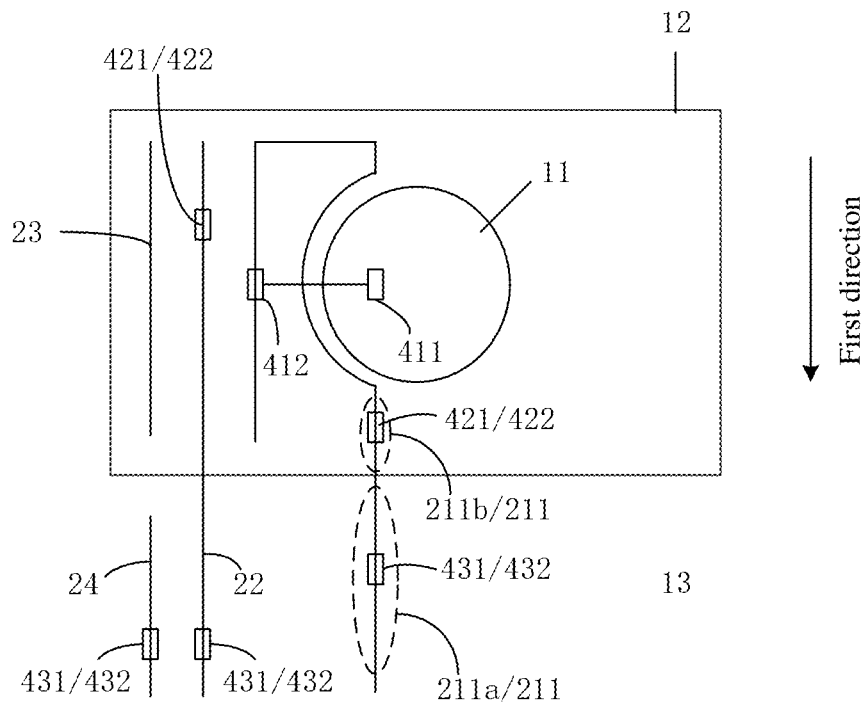
FIG. 7 is a schematic plane view of a partial region of another display substrate provided by at least one embodiment of the present disclosure.

FIG. 7 is a schematic plane view of a partial region of another display substrate provided by at least one embodiment of the present disclosure. Except for that an arrangement mode of the first signal line 21 is different, the display substrate 01 provided by this embodiment is substantially the same as the display substrate 01 shown in FIG. 6A to FIG. 6C.

For example, in some embodiments, as shown in FIG. 7, the first main body portion 211 of the first signal line 21 includes a first sub-portion 211a and a second sub-portion 211b; the first sub-portion 211a is located in the third display region 13; and the second sub-portion 211b is located in the second display region 12. The first sub-portion 211a is electrically connected with the third pixel circuit 432; and the second sub-portion 211b is electrically connected with the second pixel circuit 422. For example, the first signal line 21 is further configured to transmit a first driving signal to the second pixel circuit 422 and the third pixel circuit 432, so that the second pixel circuit 422 drives the second light-emitting element 421 to emit light and the third pixel circuit 432 drives the third light-emitting element 431 to emit light.

It should be noted that, in this embodiment, the first signal line 21 is electrically connected with the first pixel circuit 412, the second pixel circuit 422, and the third pixel circuit 432, but this does not mean that the first driving signal supplied to the first pixel circuit 412, the first driving signal supplied to the second pixel circuit 422, and the first driving signal supplied to the third pixel circuit 432 are the same. For example, progressive scanning or time-sharing scanning may be used, so that the first driving signal supplied to the first pixel circuit 412, the first driving signal supplied to the second pixel circuit 422, and the first driving signal supplied to the third pixel circuit 432 are different from each other, so as to facilitate the corresponding first light-emitting element 411, the second light-emitting element 421, and the third light-emitting element 431 to respectively display required gray scales.

For example, as shown in FIG. 7, the display substrate 01 includes a plurality of second pixel circuits 422 and a plurality of third pixel circuits 432. The plurality of second pixel circuits 422 are arranged in plurality of columns along the first direction; and the plurality of third pixel circuits 432 are arranged in plurality of columns along the first direction. For example, the second pixel circuit 422 connected with the first signal line 21 and the second pixel circuit 422 connected with the second signal line 22 are located in different columns. For example, the third pixel circuit 432 connected with the first signal line 21, the third pixel circuit 432 connected with the second signal line 22, and the third pixel circuit 432 connected with the fourth signal line 24 are located in different columns.

It should be noted that, FIG. 7 does not show the plurality of columns of pixel circuits completely, but only shows a few pixel circuits electrically connected with the first signal line 21, the second signal line 22, and the fourth signal line 24; and this does not constitute a limitation to the embodiments of the present disclosure. For the mode in which the pixel circuits are arranged in a plurality of columns, the structure shown in FIG. 3 to FIG. 5 and the conventional design may be referred to, and no details will be repeated here.

Figure 8A:
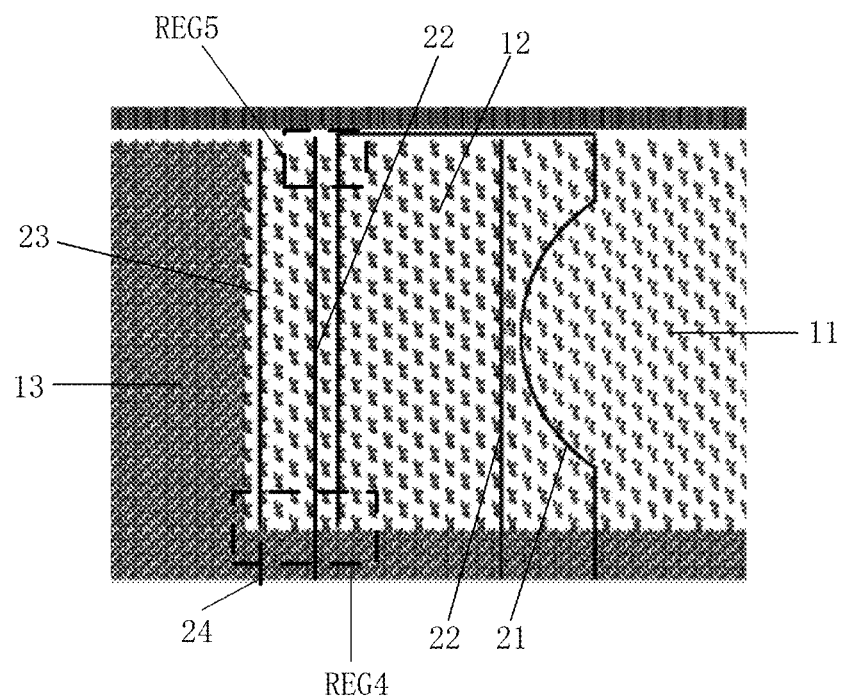
FIG. 8A is a schematic layout I of a display substrate provided by at least one embodiment of the present disclosure.
Figure 8B:
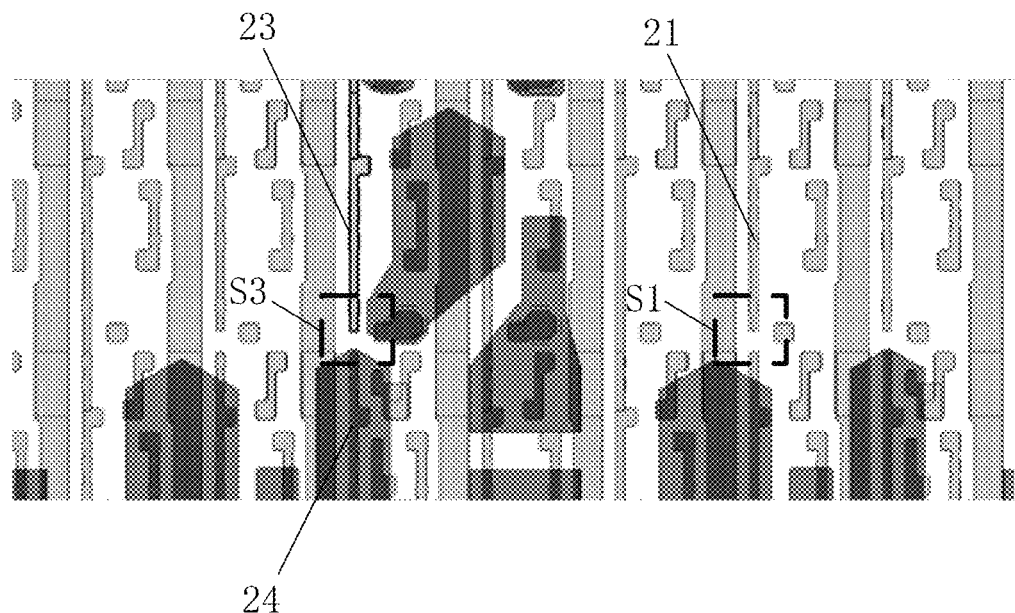
FIG. 8B is a schematic layout II of a display substrate provided by at least one embodiment of the present disclosure.
Figure 8C:
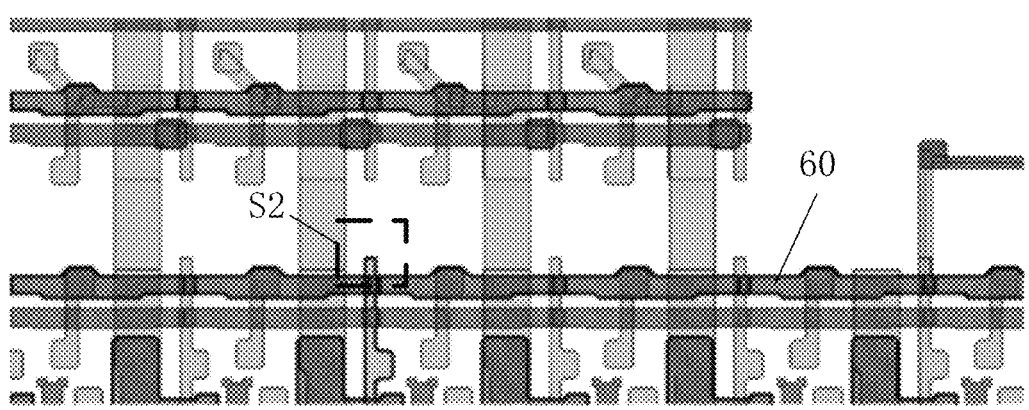
FIG. 8C is a schematic layout III of a display substrate provided by at least one embodiment of the present disclosure.
Figure 8D:
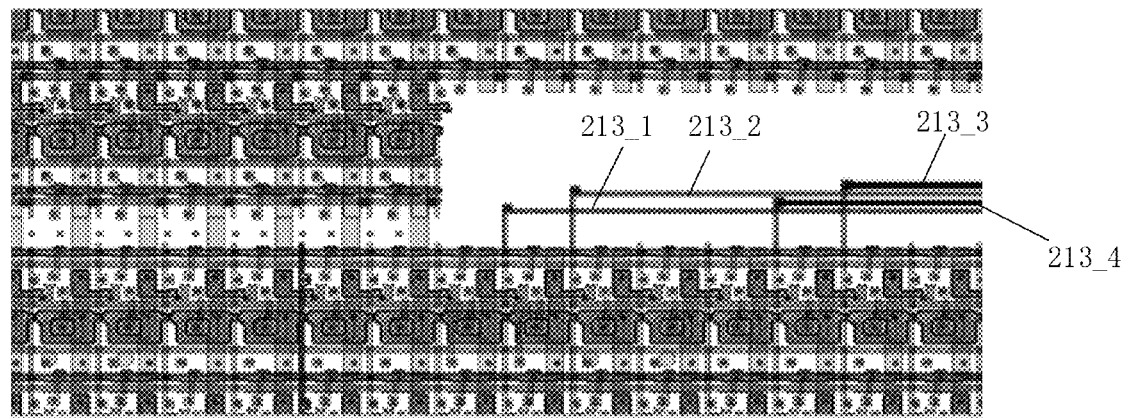
FIG. 8D is a schematic layout IV of a display substrate provided by at least one embodiment of the present disclosure.

FIG. 8A is a schematic layout I of a display substrate provided by at least one embodiment of the present disclosure; and FIG. 8A is, for example, an enlarged view of a partial region REG3 in FIG. 1. FIG. 8B is a schematic layout II of a display substrate provided by at least one embodiment of the present disclosure; and FIG. 8B is, for example, an enlarged view of a partial region REG4 in FIG. 8A. FIG. 8C is a schematic layout III of a display substrate provided by at least one embodiment of the present disclosure; and FIG. 8C is, for example, an enlarged view of a partial region REG5 in FIG. 8A. FIG. 8D is a schematic layout IV of a display substrate provided by at least one embodiment of the present disclosure; and FIG. 8D is, for example, another enlarged view of the partial region REG5 in FIG. 8A.

For example, as shown in FIG. 8A, in this example, the PPI of the plurality of first light-emitting elements 411 in the first display region 11 is substantially equal to the PPI of the plurality of second light-emitting elements 421 in the second display region 12; and the PPI of the plurality of second light-emitting elements 421 in the second display region 12 is less than the PPI of the plurality of third light-emitting elements 431 in the third display region 13.

The first signal line 21 may supply a driving signal to the first light-emitting element 411 in the first display region 11 with lower PPI through the first pixel circuit 412; and for example, a sensor (e.g., a camera) is provided in a position corresponding to the first display region 11. Because there is no pixel circuit in the first display region 11, it is necessary to use the first signal line 21 to transmit the driving signal to the first pixel circuit 412 in the second display region 12, so that the first pixel circuit 412 drives the first light-emitting element 411 to emit light. Therefore, the first signal line 21 needs to be led in from the third display region 13 and extend around the first display region 11; and the first signal line 21 ends in position S1 in FIG. 8B.

The second signal line 22 may extend from the third display region 13 to the second display region 12 along the first direction (e.g., the column direction), and end in position S2 shown in FIG. 8C. The second signal line 22 passes through the third display region 13 and the second display region 12.

The third signal line 23 and the fourth signal line 24 are located on a same extension line; and there is a gap between the third signal line 23 and the fourth signal line 24, so that the third signal line 23 and the fourth signal line 24 are insulated from each other. Therefore, the third signal line 23 and the fourth signal line 24 may be regarded as being disconnected from each other, for example, disconnected in position S3 in FIG. 8B. The third signal line 23 functions as a dummy line, so that the circuit environment in the second display region 12 may be balanced. Because the second display region 12 and the third display region 13 are not consistent in PPI, in the pixel position in the second display region 12 where the pixel circuit is not needed, the trace of the third signal line 23 is reserved, and the third signal line 23 and the fourth signal line 24 are disconnected from each other, so that uniformity of the circuit environment of the second display region 12 may be maintained.

For example, as shown in FIG. 8D, in the case where the display substrate 01 includes a plurality of first signal lines 21, first bending portions 213 of different first signal lines 21 may be alternately arranged in different metal layers. For example, first bending portions 213_1, 213_2, 213_3, and 213_4 respectively belong to 4 different first signal lines 21; the first bending portions 213_1, 213_2 may be arranged in a gate metal layer; and the first bending portions 213_3, 213_4 may be arranged in a first metal layer, which, thus, may facilitate wiring and avoid short circuits at overlapping lines. Here, the first metal layer may be any film layer different from the gate metal layer in the display substrate 01, which is not limited in the embodiments of the present disclosure.

Figure 9:
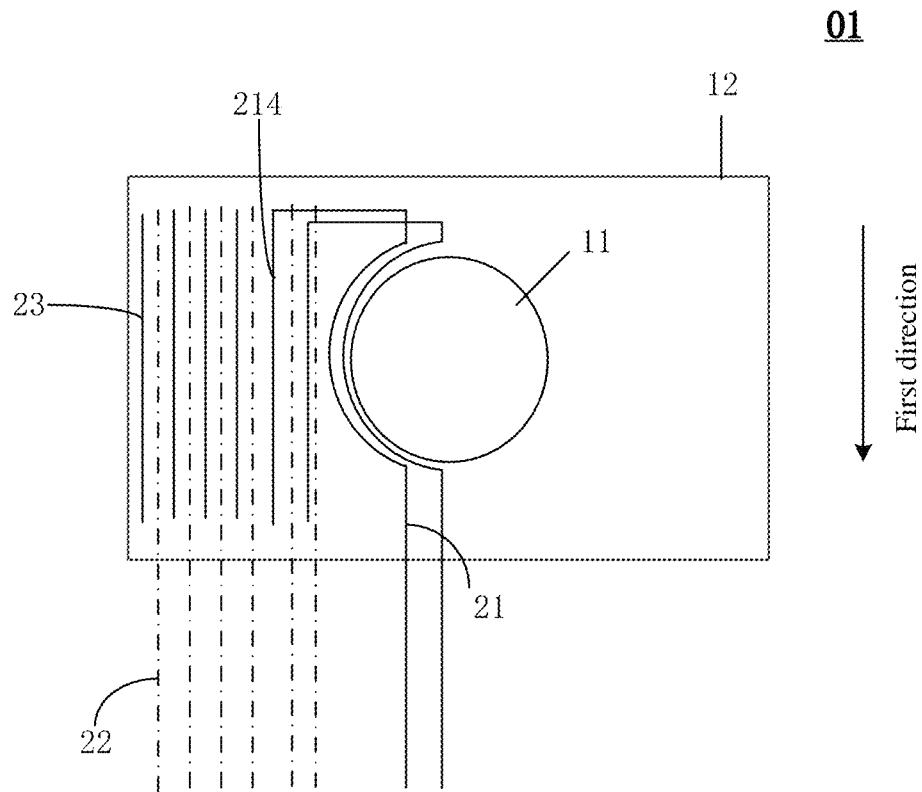
FIG. 9 is a schematic plane view of a partial region of a display substrate provided by at least one embodiment of the present disclosure.

FIG. 9 is a schematic plane view of a partial region of a display substrate provided by at least one embodiment of the present disclosure. For example, as shown in FIG. 9, in some examples, the display substrate 01 includes a plurality of first signal lines 21, a plurality of second signal lines 22, and a plurality of third signal lines 23. For example, the plurality of second signal lines 22 and the plurality of third signal lines 23 are arranged at intervals, so as to more effectively balance the circuit environment of the second display region 12. For example, the plurality of second signal lines 22 and the first connecting portions 214 of the plurality of first signal lines 21 are arranged at intervals, which, thus, may effectively utilize wiring space of the second display region 12, optimize wiring design, and improve rationality of layout. Other structures of the display substrate 01 are substantially the same as the display substrate 01 provided by the foregoing embodiments, and no details will be repeated here.

It should be noted that, the second signal lines 22 and the third signal lines 23 may be arranged at intervals according to a quantity ratio of 1:1, or may also be arranged at intervals according to any quantity ratio such as 2:1, 3:1, etc. Similarly, the second signal lines 22 and the first connecting portions 214 may be arranged at intervals according to a quantity ratio of 1:1, or may also be arranged at intervals according to any quantity ratio such as 2:1, 3:1, etc., which may be determined according to actual needs, and is not limited in the embodiments of the present disclosure.

It should be noted that, in the embodiments of the present disclosure, the respective amounts of the first signal lines 21, the second signal lines 22, and the third signal lines 23 are not limited, and may be determined according to actual needs, for example, according to factors such as the size of the display substrate 01, PPI, etc., which is not limited in the embodiments of the present disclosure.

For example, the driving signals transmitted by the first signal line 21, the second signal line 22, and the fourth signal line 24 are data signals, that is, the first signal line 21, the second signal line 22, and the fourth signal line 24 may be data lines; and the first driving signal, the second driving signal, and the third driving signal are all data signals. For example, the data signals correspond to display gray scales.

For example, the first driving signal, the second driving signal, and the third driving signal may be different data signals or a same data signal, which is not limited in the embodiments of the present disclosure.

Figure 10A:
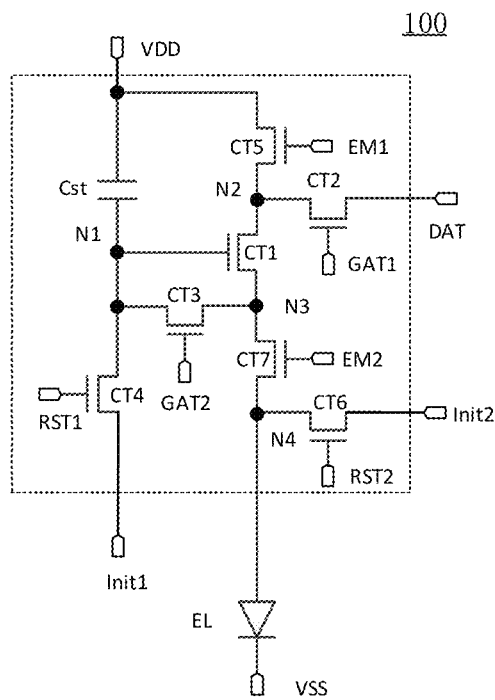
FIG. 10A is a schematic structural diagram of a 7T1C pixel circuit.

FIG. 10A is a schematic structural diagram of a 7T1C pixel circuit. For example, the foregoing first pixel circuit 412, the foregoing second pixel circuit 422, and the foregoing third pixel circuit 432 may all adopt the 7T1C pixel circuit.

For example, as shown in FIG. 10A, the 7T1C pixel circuit 100 includes a first transistor CT1, a second transistor CT2, a third transistor CT3, a fourth transistor CT4, a fifth transistor CT5, a sixth transistor CT6, a seventh transistor CT7, and a storage capacitor Cst. For example, the first transistor CT1 to the seventh transistor CT7 are all P-type transistors.

As shown in FIG. 10A, a first terminal of the storage capacitor Cst is connected with a first power supply voltage terminal VDD to receive a first power supply voltage V1; and a second terminal of the storage capacitor Cst is connected with a first node N1. A first terminal of a light-emitting element EL is connected with a fourth node N4; and a second terminal of the light-emitting element EL is connected with a second power supply voltage terminal VSS to receive a second power supply voltage V2. A control terminal of the first transistor CT1 is connected with the first node N1; a first terminal of the first transistor CT1 is connected with a second node N2; and a second terminal of the first transistor CT1 is connected with a third node N3. A first terminal of the second transistor CT2 is connected with the second node N2; and a second terminal of the second transistor CT2 is connected with a data signal terminal DAT to receive a data signal (e.g., a data voltage) Vdata. A first terminal of the third transistor CT3 is connected with the first node N1; and a second terminal of the third transistor CT3 is connected with the third node N3.

A first terminal of the fourth transistor CT4 is connected with the first node N1; and a second terminal of the fourth transistor CT4 is connected with a first reset signal terminal Init1 to receive a first reset signal Vinit1 supplied by the first reset signal terminal Init1. A first terminal of the fifth transistor CT5 is connected with the first power supply voltage terminal VDD; and the second terminal of the fifth transistor CT5 is connected with the second node N2. A first terminal of the sixth transistor CT6 is connected with the fourth node N4; and a second terminal of the sixth transistor CT6 is connected with a second reset signal terminal Init2 to receive a second reset signal Vinit2. A first terminal of the seventh transistor CT7 is connected with the third node N3; and a second terminal of the seventh transistor CT7 is connected with the fourth node N4.

For example, a control terminal GAT1 of the second transistor CT2 and a control terminal GAT2 of the third transistor CT3 are both coupled to a scan signal terminal GAT (not shown in the figure); a control terminal EM1 of the fifth transistor CT5 and a control terminal EM2 of the seventh transistor CT7 are both coupled to a light emission control terminal EM (not shown in the figure); a control terminal of the fourth transistor CT4 is connected with a first reset control terminal RST1; and a control terminal of the sixth transistor CT6 is connected with a second reset control terminal RST2. For convenience of description, FIG. 10A also shows the first node N1, the second node N2, the third node N3, the fourth node N4, and the light-emitting element EL.

Figure 10B:
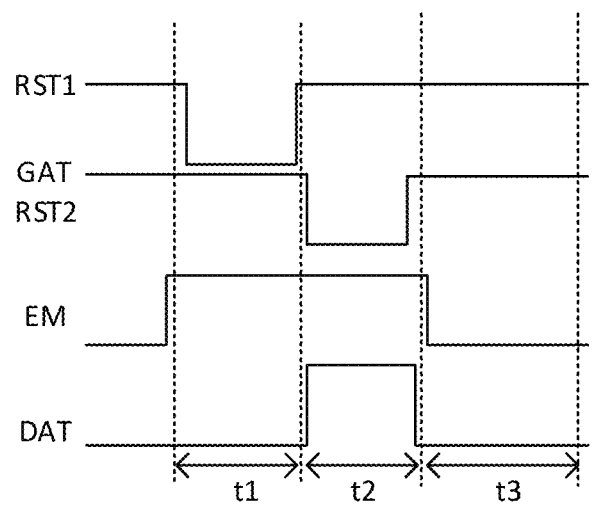
FIG. 10B is a driving timing diagram of the 7T1C pixel circuit shown in FIG. 10A.

FIG. 10B is a driving timing diagram of the 7T1C pixel circuit shown in FIG. 10A. As shown in FIG. 10B, each driving cycle of the 7T1C pixel circuit 100 includes a first phase t1, a second phase t2, and a third phase t3.

As shown in FIG. 10A and FIG. 10B, in the first phase t1, the first reset control terminal RST1 receives an active level; and the scan signal terminal GAT, the second reset control terminal RST2 and the light emission control terminal EM all receive an inactive level. In this case, the fourth transistor CT4 is turned on, the second transistor CT2, the third transistor CT3, the fifth transistor CT5, the sixth transistor CT6, and the seventh transistor CT7 are turned off; the fourth transistor CT4 is configured to receive the first reset signal (e.g., a reset voltage) Vinit1, and write the first reset signal Vinit1 to the storage capacitor Cst to reset the storage capacitor Cst; a voltage of the first node N1 is Vinit1, and Vinit1 is, for example, a negative value. For example, after resetting the storage capacitor Cst, the first transistor CT1 is turned on.

As shown in FIG. 10A and FIG. 10B, in the second phase t2, the scan signal terminal GAT and the second reset control terminal RST2 receive an active level, and the first reset control terminal RST1 and the light emission control terminal EM receive an inactive level. In this case, the first transistor CT1 to the third transistor CT3 and the sixth transistor CT6 are turned on, the fourth transistor CT4, the fifth transistor CT5 and the seventh transistor CT7 are turned off; the second transistor CT2 receives the data signal Vdata, and the data signal Vdata is written by the turned-on first transistor CT1 and the turned-on third transistor CT3 to the control terminal of the first transistor CT1, the storage capacitor Cst stores the data signal Vdata written to the control terminal of the first transistor CT1 at the control terminal of the first transistor CT1, a voltage of the first node N1 is Vdata+Vth; the sixth transistor CT6 is configured to receive a second reset signal (e.g., a reset voltage) Vinit2, and write the second reset signal Vinit2 to the first terminal of the light-emitting element EL, so as to reset the first terminal of the light-emitting element EL. A voltage of the fourth node N4 is Vinit2, and Vinit2 is, for example, a negative value.

As shown in FIG. 10A and FIG. 10B, in the third phase t3, the light emission control terminal EM receives an active level, and the first reset control terminal RST1, the scan signal terminal GAT, and the second reset control terminal RST2 receive an inactive level. In this case, the first transistor CT1, the fifth transistor CT5 and the seventh transistor CT7 are turned on, the second transistor CT2, the third transistor CT3, the fourth transistor CT4, and the sixth transistor CT6 are turned off; the first transistor CT1 is configured to control a driving current that flows through the first transistor CT1 and from the first power supply voltage terminal VDD to the light-emitting element EL and is used to drive the light-emitting element EL, based on the data signal (e.g., data voltage) Vdata stored in the storage capacitor Cst and the received first power supply voltage V1; a voltage of the first node N1 is Vdata+Vth, a voltage of the second node N2 is VDD; and the driving current Id may be expressed by a formula below:

$$Id = \frac{k}{2}(Vgs - Vth)^2$$
$$= \frac{k}{2}(Vg - Vs - Vth)^2$$
$$= \frac{k}{2}(Vdata + Vth - V1 - Vth)^2$$

-continued
$$= \frac{k}{2}(Vdata - V1)^2.$$

Here, k=μ×Cox×W/L; μ is mobility of carriers in the first transistor CT1, Cox is capacitance of a gate oxide layer of the first transistor CT1, W/L is a width-to-length ratio of a channel of the first transistor CT1, Vth is a threshold voltage of the first transistor CT1, Vth is a gate-source voltage of the first transistor CT1, Vg is a gate voltage of the first transistor CT1, and Vs is a source voltage of the first transistor CT1.

It can be seen from the above-described formula that, the driving current Id generated by the first transistor CT1 is irrelevant to the threshold voltage of the first transistor CT1, so the 7T1C pixel circuit 100 shown in FIG. 10A and FIG. 10B has a threshold compensation function.

It should be noted that, in the embodiments of the present disclosure, the first pixel circuit 412, the second pixel circuit 422, and the third pixel circuit 432 are not limited to adopting the above-described 7T1C pixel circuit, and other applicable pixel circuits may also be used, which is not limited in the embodiments of the present disclosure. Specific circuit structures of the first pixel circuit 412, the second pixel circuit 422, and the third pixel circuit 432 may be the same or different from each other, which may be determined according to actual needs, and is not limited in the embodiments of the present disclosure.

For example, each of the first pixel circuit 412, the second pixel circuit 422, and the third pixel circuit 432 includes a switching thin film transistor; and the switching thin film transistor is, for example, the second transistor CT2 in FIG. 10A. For example, the switching thin film transistor (e.g., the second transistor CT2) includes a gate electrode, a first electrode and a second electrode; the first signal line 21, the second signal line 22 or the fourth signal line 24 is electrically connected with the first electrode or the second electrode of the switching thin film transistor. That is, the first signal line 21, the second signal line 22, or the fourth signal line 24 may be electrically connected with the data signal terminal DAT in FIG. 10A to supply the data signal.

For example, the foregoing first light-emitting element 411, the foregoing second light-emitting element 421, and the foregoing third light-emitting element 431 include an organic light-emitting diode (OLED). That is, the first light-emitting element 411, the second light-emitting element 421, or the third light-emitting element 431 may be the light-emitting element EL in FIG. 10A; and the light-emitting element EL may be an OLED. Of course, the embodiments of the present disclosure are not limited thereto; and the first light-emitting element 411, the second light-emitting element 421, and the third light-emitting element 431 may also be quantum dot light-emitting diodes (QLEDs) or other applicable light-emitting devices, which may not be limited in the embodiments of the present disclosure.

Figure 11:
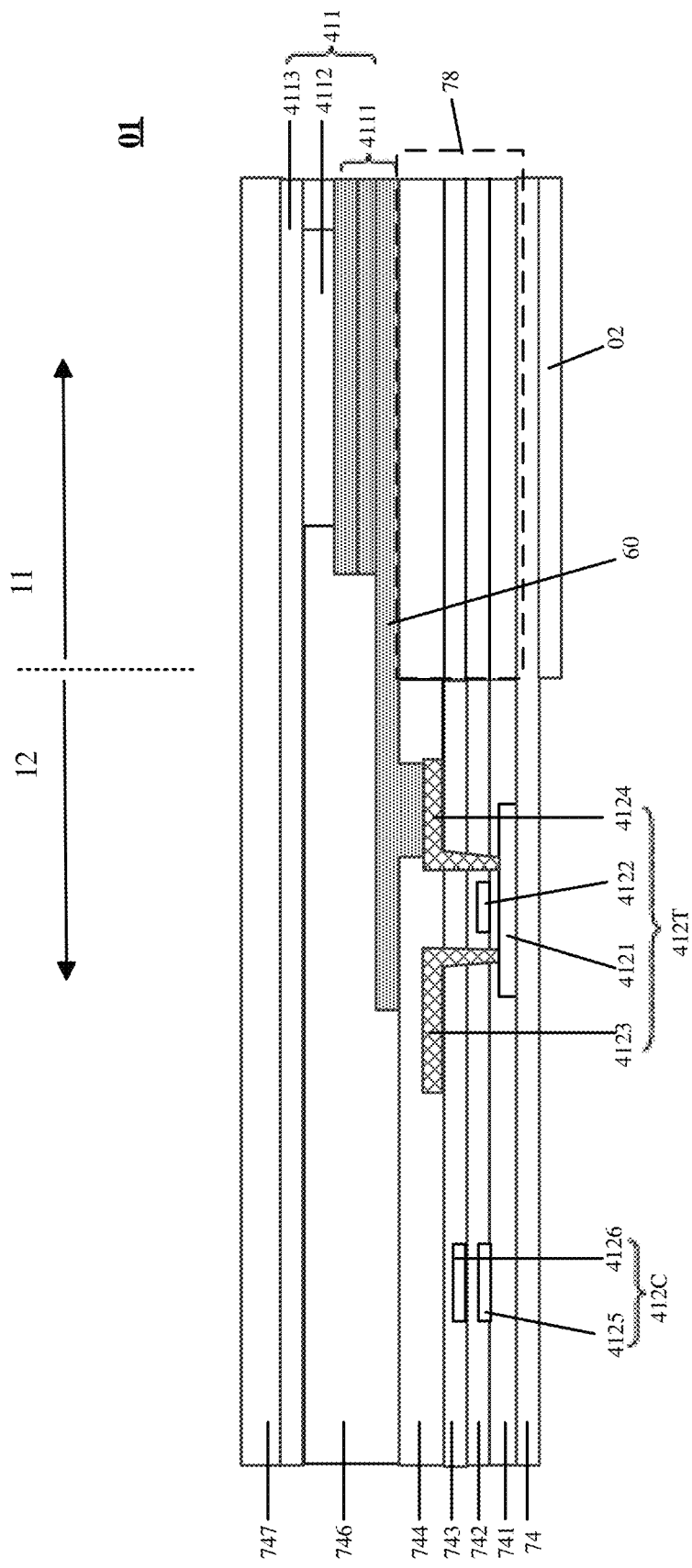
FIG. 11 is a schematic diagram of a laminated structure of a display substrate provided by at least one embodiment of the present disclosure.

FIG. 11 is a schematic diagram of a laminated structure of a display substrate provided by at least one embodiment of the present disclosure; and the schematic diagram of the laminated structure mainly schematically shows the first pixel circuit 412 and the first light-emitting element 411.

For example, the first pixel circuit 412 includes structures such as a switching thin film transistor 412T and a storage capacitor 412C. The first light-emitting element 411 includes a first anode structure 4111, a first cathode structure 4113, and a first light emitting layer 4112 located between the first anode structure 4111 and the first cathode structure 4113; and the first anode structure 4111 is electrically connected with the switching thin film transistor 412T included in the first pixel circuit 412 through a via hole. For example, in some examples, the first anode structure 4111 may be integrally formed with the foregoing connecting line 60, that is, the connecting line 60 may be regarded as a portion of the first anode structure 4111. For example, in some other examples, an ITO layer may be separately provided to form the connecting line 60; and the ITO layer is, for example, located between the source-drain metal layer (SD layer) and a film layer where the first anode structure 4111 is located, and implements required electrical connection through a via hole. For example, the first anode structure 4111 may include a plurality of anode sub-layers, for example, may include an ITO/Ag/ITO three-layer structure (not shown in the figure), etc.; and the specific form of the first anode structure 4111 is not limited in the embodiments of the present disclosure.

For example, the first cathode structure 4113 may be a structure formed on an entire surface of the display substrate 01; and the first cathode structure 4113, for example, may include metal materials such as lithium (Li), aluminum (Al), magnesium (Mg), silver (Ag), etc. For example, because the first cathode structure 4113 may be formed as a very thin layer, the first cathode structure 4113 has good light transmittance.

For example, the switching thin film transistor 412T includes an active layer 4121, a gate electrode 4122, and a source-drain electrode (i.e., a source electrode 4123 and a drain electrode 4124); and the storage capacitor 412C includes a first capacitor plate 4125 and a second capacitor plate 4126. For example, the active layer 4121 is provided on a base substrate 74; and a first gate insulating layer 741 is provided on a side of the active layer 4121 away from the base substrate 74. The gate electrode 4122 is provided in a same layer as the first capacitor plate 4125 and is located on a side of the first gate insulating layer 741 away from the base substrate 74; and a second gate insulating layer 742 is provided on a side of the gate electrode 4122 and the first capacitor plate 4125 away from the base substrate 74. The second capacitor plate 4126 is provided on a side of the second gate insulating layer 742 away from the base substrate 74, and an interlayer insulating layer 743 is provided on a side of the second capacitor plate 4126 away from the base substrate 74. The source-drain electrode is provided on a side of the interlayer insulating layer 743 away from the base substrate 74, and is electrically connected with the active layer 4121 through via holes located in the first gate insulating layer 741, the second gate insulating layer 742, and the interlayer insulating layer 743. A planarization layer 744 is provided on a side of the source-drain electrode away from the base substrate 74 to planarize the first pixel circuit 412.

For example, the planarization layer 744 has a via hole; and the first anode structure 4111 is electrically connected with the source electrode 4123 or the drain electrode 4124 of the switching thin film transistor 412T through the via hole in the planarization layer 744.

For example, the first display region 11 further includes a transparent support layer 78 located on the base substrate 74; and the first light-emitting element 411 is located on a side of the transparent support layer 78 away from the base substrate 74. Thus, with respect to the base substrate 74, the first light-emitting element 411 in the first display region 11 may be located at a height substantially the same as the second light-emitting element 421 in the second display region 12 and the third light-emitting element 431 in the third display region 13, so that the display effect of the display substrate 01 may be improved.

For example, in the embodiments of the present disclosure, the first main body portion 211, the first winding portion 212, the first connecting portion 214, the second signal line 22, and the third signal line 23 may be located in a same layer. For example, in the display substrate 01, the film layer where the source-drain electrode (i.e., the source electrode 4123 and the drain electrode 4124) is located is referred to as a source-drain metal layer (SD layer), that is, as shown in FIG. 11, the first electrode and the second electrode (i.e., the source electrode 4123 and the drain electrode 4124) of the switching thin film transistor 412T are located in the source-drain metal layer. For example, the first main body portion 211, the first winding portion 212, the first connecting portion 214, the second signal line 22, and the third signal line 23 are located in the source-drain metal layer, that is, arranged in a same layer as the source electrode 4123 and the drain electrode 4124.

For example, in the embodiments of the present disclosure, the first bending portion 213 and the first connecting portion 214 are located in different layers; and in the case where the first main body portion 211, the first winding portion 212, the first connecting portion 214, the second signal line 22 and the third signal line 23 are arranged in a same layer, the first bending portion 213 is located in a layer different from any one of the first main body portion 211, the first winding portion 212, the first connecting portion 214, the second signal line 22, and the third signal line 23. For example, in the display substrate 01, the film layer where the gate electrode 4122 is located is referred to as a gate metal layer, that is, as shown in FIG. 11, the gate electrode 4122 of the switching thin film transistor 412T is located in the gate metal layer. For example, the first bending portion 213 of at least one of the first signal lines 21 is located in the gate metal layer, that is, the first bending portion 213 of at least one of the first signal lines 21 is provided in a same layer as the gate electrode 4122. For example, it may be that first bending portions 213 of all the first signal lines 21 are located in the gate metal layer, or may also be that first bending portions 213 of only some first signal lines 21 are located in the gate metal layer, which is not limited in the embodiments of the present disclosure.

For example, the display substrate 01 may further include a first metal layer; the first metal layer and the gate metal layer are different film layers; and the first metal layer is insulated from the gate metal layer. For example, the first metal layer is any other metal layer different from the gate metal layer in the display substrate 01. For example, in some examples, among the plurality of first signal lines 21, first bending portions 213 of some first signal lines 21 are located in the gate metal layer, and first bending portions 213 of the other first signal lines 21 are located in the first metal layer. For example, first bending portions 213 of different first signal lines 21 may be alternately arranged in the gate metal layer and the first metal layer. For example, as shown in FIG. 11, first bending portions 213 of different first signal lines 21 may be alternately arranged in a same layer as the gate electrode 4122 and the second capacitor plate 4126, that is, first bending portions 213 of some first signal lines 21 are arranged in a same layer as the gate electrode 4122, and first bending portions 213 of the other first signal lines 21 are arranged in a same layer as the second capacitor plate 4126.

The above-described arrangement mode can be compatible with the existing process, make minor changes to the process, facilitate wiring, and may reduce difficulties in wiring design.

Of course, the embodiments of the present disclosure are not limited thereto; in some other examples, the first signal line 21, the second signal line 22, and the third signal line 23 may also be located in a same layer, that is, located in a same film layer in the display substrate 01, which, thus, may reduce the thickness of the display substrate 01, facilitate preparation in a same process, and simplify the preparation process. The film layer relationship of the first signal line 21, the second signal line 22, and the third signal line 23 may be determined according to actual needs, and the three may be located in a same layer or different layers, which is not limited in the embodiments of the present disclosure. For example, any two of the first signal line 21, the second signal line 22, and the third signal line 23 may be located in a same layer, and the rest may be located in a different layer; or, all the three may be located in different layers. For example, the fourth signal line 24 may be located in a same layer as any one or more of the first signal line 21, the second signal line 22, and the third signal line 23, or may be located in a layer different from the first signal line 21, the second signal line 22 and the third signal line 23, which is not limited in the embodiments of the present disclosure.

For example, in some examples, the first signal line 21, the second signal line 22, and the third signal line 23 include a metal trace; and at least a portion of the metal trace, for example, is located in the source-drain metal layer of the display substrate 01. For example, a portion of the metal trace except for the first bending portion 213 is entirely located in the source-drain metal layer. Therefore, when preparing the source electrode and the drain electrode in the source-drain metal layer, the second signal line 22, the third signal line 23, as well as the first main body portion 211, the first winding portion 212 and the first connecting portion 214 of the first signal line 21 may be prepared together, which, thus, may simplify the production process, improve production efficiency, and reduce production costs. In this case, when preparing the gate electrode in the gate metal layer, the metal trace serving as the first bending portion 213 may be prepared together.

For example, in some other examples, the first signal line 21, the second signal line 22, and the third signal line 23 may include a transparent conductive trace, which is made of, for example, indium tin oxide (ITO). For example, the transparent conductive trace may be provided in any suitable film layer, which is not limited in the embodiments of the present disclosure. By setting the first signal line 21, the second signal line 22, and the third signal line 23 as a transparent conductive trace, the light transmittance of the display substrate 01 can be improved.

For example, in some embodiments, as shown in FIG. 11, the display substrate 01 further includes structures such as a pixel defining layer 746, an encapsulation layer 747, etc. For example, the pixel defining layer 746 is provided on the first anode structure 4111 (e.g., a portion of the first anode structure 4111), and includes a plurality of openings to define different pixels or sub-pixels; and the first light emitting layer 4112 is formed in the openings of the pixel defining layer 746. For example, the encapsulation layer 747 may include a single-layer or multi-layer encapsulation structure, for example, the multi-layer encapsulation structure includes a laminate of an inorganic encapsulation layer and an organic encapsulation layer, thereby improving the encapsulation effect on the display substrate 01.

For example, the pixel defining layers 746 in the first display region 11, the second display region 12, and the third display region 13 are arranged in a same layer; and the encapsulation layers 747 in the first display region 11, the second display region 12 and the third display region 13 are arranged in a same layer, or may also be integrally connected in some embodiments, which is not limited in the embodiments of the present disclosure.

For example, in various embodiments of the present disclosure, the base substrate 74 may be a glass substrate, a quartz substrate, a metal substrate, or a resin substrate, etc., and may be a rigid substrate or a flexible substrate, which is not limited in the embodiments of the present disclosure.

For example, the first gate insulating layer 741, the second gate insulating layer 742, the interlayer insulating layer 743 as well as the planarization layer 744, the insulating layer 745, the pixel defining layer 746, and the encapsulation layer 747 may include inorganic insulating materials such as silicon oxide, silicon nitride, silicon oxynitride, or may include organic insulating materials such as polyimide, polyphthalimide, polyamide, acrylic resin, benzocyclobutene, or phenolic resin. Materials of the above-described respective functional layers are not specifically limited in the embodiments of the present disclosure.

For example, a material of the active layer 4121 may include semiconductor materials such as polysilicon or oxide semiconductor (e.g., indium gallium zinc oxide). For example, a portion of the active layer 4121 may be conductorized by a conductorization process such as doping, so as to have higher conductivity.

For example, materials of the gate electrode 4122, the first capacitor plate 4125, and the second capacitor plate 4126 may include metal materials or alloy materials, for example, include molybdenum, aluminum, and titanium, etc.

For example, materials of the source electrode 4123 and the drain electrode 4124 may include metal materials or alloy materials, for example, a metal single-layer or multi-layer structure formed of molybdenum, aluminum, titanium, etc., for example, the multi-layer structure is a multi-metal laminated layer, for example, titanium, aluminum, titanium (Ti/Al/Ti) metal laminated layer, etc.

For example, the display substrate 01 provided by the embodiments of the present disclosure may be an organic light-emitting diode (OLED) display substrate or a quantum dot light-emitting diode (QLED) display substrate, etc.; and the specific type of the display substrate is not limited in the embodiments of the present disclosure.

For example, in the case where the display substrate is an organic light-emitting diode display substrate, the light emitting layer (e.g., the foregoing first light emitting layer 4112) may include small molecular organic materials or polymer molecular organic materials, which may be fluorescent light-emitting materials or phosphorescent light-emitting materials, and may emit red light, green light, blue light, or white light. In addition, in different examples, the light emitting layer may further include functional layers such as an electron injection layer, an electron transport layer, a hole injection layer, and a hole transport layer according to different actual needs.

For example, in the case where the display substrate is a quantum dot light-emitting diode (QLED) display substrate, the light emitting layer (e.g., the foregoing first light emitting layer 4112) may include quantum dot materials, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots and indium arsenide quantum dots, etc. and a particle size of a quantum dot ranges, for example, from 2 nm to 20 nm.

At least one embodiment of the present disclosure further provides a display device; and the display device includes the display substrate provided by any one embodiment of the present disclosure. The display device can meet driving requirements of different display regions, and can balance the circuit environment, optimize wiring design, improve rationality of layout, ensure normal display, and help improve performance of a full-screen display device.

Figure 12:
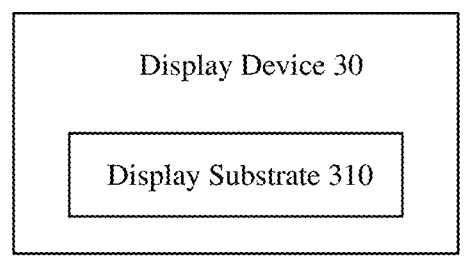
FIG. 12 is a schematic block diagram of a display device provided by at least one embodiment of the present disclosure.

FIG. 12 is a schematic block diagram of a display device provided by at least one embodiment of the present disclosure. For example, as shown in FIG. 12, a display device 30 includes a display substrate 310; and the display substrate 310 is the display substrate provided by any one embodiment of the present disclosure, for example, the foregoing display substrate 01. The display device 30 may be any electronic device having a display function, for example, a smart phone, a laptop, a tablet personal computer, a television, etc. For example, in the case where the display device 30 is a smart phone or a tablet personal computer, the smart phone or the tablet personal computer may have full-screen design, that is, there is no peripheral region surrounding the third display region 13. In addition, the smart phone or the tablet personal computer also has an under-screen sensor (e.g., a camera, an infrared sensor, etc.), which may perform operations such as image shooting, distance sensing, light intensity sensing, etc.

It should be noted that, with respect to the display substrate 310 and other components of the display device 30 (e.g., an image data encoding/decoding device, a clock circuit, etc.), applicable components may be used, which should be understood by those ordinarily skilled in the art, no details will be repeated here, and this should not constitute a limitation to the embodiments of the present disclosure.

Figure 13:
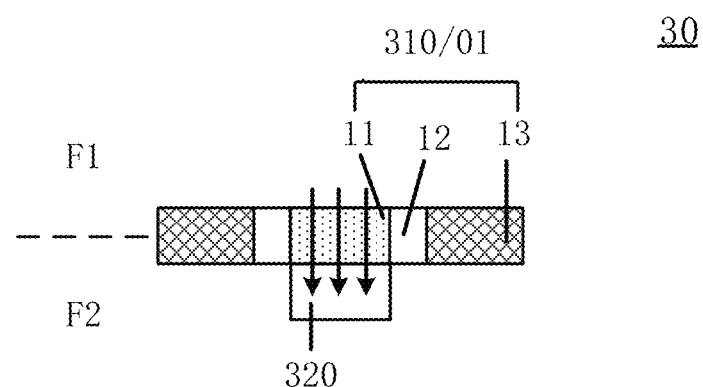
FIG. 13 is a schematic diagram of a laminated structure of a display device provided by at least one embodiment of the present disclosure.

FIG. 13 is a schematic diagram of a laminated structure of a display device provided by at least one embodiment of the present disclosure. For example, as shown in FIG. 13, the display device 30 includes a display substrate 310; and the display substrate 310 is the display substrate provided by any one embodiment of the present disclosure, for example, the foregoing display substrate 01. For example, the display device 30 further includes a sensor 320.

For example, the display substrate 01 includes a first side F1 for display and a second side F2 opposite to the first side F1. That is, the first side F1 is a display side, and the second side F2 is a non-display side. The display substrate 01 is configured to perform a display operation on the first side F1, that is, the first side F1 of the display substrate 01 is a light emergent side of the display substrate 01, and the first side F1 faces the user. The first side F1 and the second side F2 are opposed to each other in a normal line direction of a display surface of the display substrate 01.

As shown in FIG. 13, the sensor 320 is provided on the second side F2 of the display substrate 01; and the sensor 320 is configured to receive light from the first side F1. For example, the sensor 320 and the first display region 11 are stacked in the normal line direction of the display surface of the display substrate 01 (e.g., a direction perpendicular to the display substrate 01); the sensor 320 may receive and process a light signal passing through the first display region 11; and the light signal may be visible light, infrared light, etc. For example, the first display region 11 allows light from the first side F1 to be at least partially transmitted to the second side F2. For example, the first display region 11 is not provided with a pixel circuit, and in this case, light transmittance of the first display region 11 can be improved.

For example, an orthogonal projection of the sensor 320 on the display substrate 01 at least partially overlaps with the first display region 11. For example, in some examples, in the case where a direct-lit arrangement mode is adopted, the orthogonal projection of the sensor 320 on the display substrate 01 is located within the first display region 11. For example, in some other examples, in the case where other light guide element (e.g., a light guide plates, a light guide tube, etc.) is adopted to make light incident on the sensor 320 from a side face, the orthogonal projection of the sensor 320 on the display substrate 01 partially overlaps with the first display region 11. In this case, because light can propagate laterally to the sensor 320, the sensor 320 does not need to be completely located in a position corresponding to the first display region 11.

For example, by providing the first pixel circuit 412 in the second display region 12, and making the sensor 320 and the first display region 11 stack in the normal line direction of the display surface of the display substrate 01, shielding by the element in the first display region 11 with respect to the light signal incident to the first display region 11 and irradiated to the sensor 320 can be reduced, which, thus, may improve the signal-to-noise ratio of image output by the sensor 320. For example, the first display region 11 may be referred to as a high light-transmittance region of a low-resolution region of the display substrate 01.

For example, the sensor 320 may be an image sensor, which may be used to acquire an image of an external environment facing a light-collecting surface of the sensor 320, and may be, for example, a complementary metal oxide semiconductor (CMOS) image sensor or a charge coupled device (CCD) image sensor. The sensor 320 may also be an infrared sensor, a distance sensor, or the like. For example, in the case where the display device 30 is a mobile terminal such as a mobile phone, a laptop, etc., the sensor 320 may be implemented as a camera of a mobile terminal such as a mobile phone, a laptop, etc., and may also include, for example, an optical device such as a lens, a mirror, or an optical waveguide according to needs, so as to modulate the optical path. For example, the sensor 320 may include photosensitive pixels arranged in an array. For example, each photosensitive pixel may include a photosensitive detector (e.g., a photodiode, a phototransistor) and a switch transistor (e.g., a switching thin film transistor). For example, the photodiode may convert a light signal irradiated thereon into an electrical signal; and the switch transistor may be electrically connected with the photodiode to control whether the photodiode is in a state of collecting a light signal and the time for collecting the light signal.

In some examples, the anode of the first light-emitting element 411 adopts a ITO/Ag/ITO laminated structure, then in the first display region 11, only the anode of the first light-emitting element 411 is opaque, that is, a trace used for driving the first light-emitting element 411 bypasses the first display region 11 or is set as a transparent trace. In this case, not only can light transmittance of the first display region 11 be further improved, but also diffraction caused by various elements in the first display region 11 may be reduced.

It should be noted that, in the embodiments of the present disclosure, the display device 30 may further include more components and structures, which are not limited in the embodiments of the present disclosure. For the technical effects and detailed description of the display device 30, the above description about the display substrate 01 may be referred to, and no details will be repeated here.

The following statements need to be noted.

(1) The drawings of the embodiments of the present disclosure involve only the structures related to the embodiments of the present disclosure, and other structures may be referred to general design.

(2) In case of no conflict, the embodiments of the present disclosure and the features in the embodiments can be combined with each other to obtain new embodiments.

What have been described above merely are specific implementations of the present disclosure, but the protection scope of the present disclosure is not limited to this. The protection scope of the present disclosure is determined by the appended claims.

What is claimed is:

1. A display substrate, having a first side for display and a second side opposite to the first side, and comprising a display region,
    wherein the display region comprises a first display region, a second display region, and a third display region, the second display region at least partially surrounds the first display region, the third display region at least partially surrounds the second display region, and the first display region, the second display region, and the third display region do not overlap with each other;
    the first display region comprises at least one first light-emitting element, and the first display region allows light from the first side to be at least partially transmitted to the second side;
    the second display region comprises at least one first pixel circuit, at least one second light-emitting element, and at least one second pixel circuit, the first light-emitting element is electrically connected with the first pixel circuit, and the second light-emitting element is electrically connected with the second pixel circuit;
    the third display region comprises at least one third light-emitting element and at least one third pixel circuit, and the third light-emitting element is electrically connected with the third pixel circuit;
    the display substrate is provided with at least one first signal line, at least one second signal line, and at least one third signal line;
    the first signal line comprises a first main body portion, a first winding portion, a first bending portion, and a first connecting portion that are connected in sequence;
    the first main body portion and the first connecting portion both extend along a first direction, a dummy extension line of the first main body portion along the first direction does not overlap with a dummy extension line of the first connecting portion along the first direction, and the first winding portion extends along a curve;
    the first winding portion, the first bending portion, and the first connecting portion are all in the second display region, the first main body portion is at least partially in the second display region, and the dummy extension line of the first main body portion along the first direction passes through the first display region;
    the first connecting portion is electrically connected with the first pixel circuit, the first signal line is configured to transmit a first driving signal to the first pixel circuit, so that the first pixel circuit drives the first light-emitting element to emit light;
    the second signal line extends along the first direction and comprises a first portion and a second portion, the first portion is in the third display region, and the second portion is in the second display region;
    the first portion is electrically connected with the third pixel circuit, the second portion is electrically connected with the second pixel circuit, the second signal line is configured to transmit a second driving signal to the second pixel circuit and the third pixel circuit, so that the second pixel circuit drives the second light-emitting element to emit light and the third pixel circuit drives the third light-emitting element to emit light; and
    the third signal line is in the second display region and extends along the first direction, and the third signal line is floating.

2. The display substrate according to claim 1, further comprising at least one fourth signal line,
    wherein the fourth signal line is in the third display region and extends along the first direction, the fourth signal line is electrically connected with the third pixel circuit, and the fourth signal line is configured to transmit a third driving signal to the third pixel circuit, so that the third pixel circuit drives the third light-emitting element to emit light; and
    the third signal line and the fourth signal line are located on a same extension line, and there is a gap between the third signal line and the fourth signal line, so that the third signal line and the fourth signal line are insulated from each other.

3. The display substrate according to claim 2, wherein the extension line is a straight line.

4. The display substrate according to claim 2, wherein the first main body portion of the first signal line comprises a first sub-portion and a second sub-portion, the first sub-portion is in the third display region, and the second sub-portion is in the second display region;
    the first sub-portion is electrically connected with the third pixel circuit, and the second sub-portion is electrically connected with the second pixel circuit; and
    the first signal line is further configured to transmit the first driving signal to the second pixel circuit and the third pixel circuit, so that the second pixel circuit drives the second light-emitting element to emit light and the third pixel circuit drives the third light-emitting element to emit light.

5. The display substrate according to claim 4, wherein the at least one second pixel circuit comprises a plurality of second pixel circuits, and the plurality of second pixel circuits are arranged in a plurality of columns along the first direction; and
    second pixel circuits connected with the first signal line and second pixel circuits connected with the second signal line are located in different columns.

6. The display substrate according to claim 4, wherein the at least one third pixel circuit comprises a plurality of third pixel circuits, and the plurality of third pixel circuits are arranged in a plurality of columns along the first direction; and
    third pixel circuits connected with the first signal line, third pixel circuits connected with the second signal line, and third pixel circuits connected with the fourth signal line are located in different columns.

7. The display substrate according to claim 1, wherein the first winding portion has a distance from an edge of the first display region, and the first winding portion extends along an extension direction of the edge of the first display region.

8. The display substrate according to claim 7, wherein a shape of the first display region is a circle or an ellipse, and the first winding portion extends along an arc.

9. The display substrate according to claim 1, wherein the at least one second signal line comprises a plurality of second signal lines, the at least one third signal line comprises a plurality of third signal lines, and the plurality of second signal lines and the plurality of third signal lines are arranged at intervals.

10. The display substrate according to claim 1, wherein the at least one second signal line comprises a plurality of second signal lines, the at least one first signal line comprises a plurality of first signal lines, and the plurality of second signal lines and first connecting portions of the plurality of first signal lines are arranged at intervals.

11. The display substrate according to claim 2, wherein the first driving signal, the second driving signal, and the third driving signal are different data signals or same data signals, and the data signals correspond to display gray scales.

12. The display substrate according to claim 2, wherein each of the first pixel circuit, the second pixel circuit, and the third pixel circuit comprises a switching thin film transistor, and the switching thin film transistor comprises a gate electrode, a first electrode and a second electrode; and
the first signal line, the second signal line, or the fourth signal line is electrically connected with the first electrode or the second electrode of the switching thin film transistor.

13. The display substrate according to claim 12, wherein the first main body portion, the first winding portion, the first connecting portion, the second signal line, and the third signal line are in a same layer.

14. The display substrate according to claim 13, further comprising a source-drain metal layer,
wherein the first electrode and the second electrode of the switching thin film transistor are in the source-drain metal layer, and
the first main body portion, the first winding portion, the first connecting portion, the second signal line, and the third signal line are in the source-drain metal layer.

15. The display substrate according to claim 13, wherein the first bending portion and the first connecting portion are in different layers.

16. The display substrate according to claim 15, further comprising a gate metal layer,
wherein the gate electrode of the switching thin film transistor is in the gate metal layer, and
the first bending portion of at least one of the first signal lines is in the gate metal layer.

17. The display substrate according to claim 16, further comprising a first metal layer,
wherein the first metal layer is a film layer different from the gate metal layer, and is insulated from the gate metal layer,
the at least one first signal line comprises a plurality of first signal lines, first bending portions of part of the first signal lines are in the gate metal layer, and first bending portions of other part of the first signal lines are in the first metal layer.

18. The display substrate according to claim 1, wherein the first signal line, the second signal line, and the third signal line comprise a metal trace or a transparent conductive trace.

19. The display substrate according to claim 1, wherein pixels per inch of second light-emitting elements in the second display region is less than pixels per inch of third light-emitting elements in the third display region.

20. A display device, comprising a display substrate, wherein the display substrate has a first side for display and a second side opposite to the first side, and comprises a display region,
wherein the display region comprises a first display region, a second display region, and a third display region, the second display region at least partially surrounds the first display region, the third display region at least partially surrounds the second display region, and the first display region, the second display region, and the third display region do not overlap with each other;
the first display region comprises at least one first light-emitting element, and the first display region allows light from the first side to be at least partially transmitted to the second side;
the second display region comprises at least one first pixel circuit, at least one second light-emitting element, and at least one second pixel circuit, the first light-emitting element is electrically connected with the first pixel circuit, and the second light-emitting element is electrically connected with the second pixel circuit;
the third display region comprises at least one third light-emitting element and at least one third pixel circuit, and the third light-emitting element is electrically connected with the third pixel circuit;
the display substrate is provided with at least one first signal line, at least one second signal line, and at least one third signal line;
the first signal line comprises a first main body portion, a first winding portion, a first bending portion, and a first connecting portion that are connected in sequence;
the first main body portion and the first connecting portion both extend along a first direction, a dummy extension line of the first main body portion along the first direction does not overlap with a dummy extension line of the first connecting portion along the first direction, and the first winding portion extends along a curve;
the first winding portion, the first bending portion, and the first connecting portion are all in the second display region, the first main body portion is at least partially in the second display region, and the dummy extension line of the first main body portion along the first direction passes through the first display region;
the first connecting portion is electrically connected with the first pixel circuit, the first signal line is configured to transmit a first driving signal to the first pixel circuit, so that the first pixel circuit drives the first light-emitting element to emit light;
the second signal line extends along the first direction and comprises a first portion and a second portion, the first portion is in the third display region, and the second portion is in the second display region;
the first portion is electrically connected with the third pixel circuit, the second portion is electrically connected with the second pixel circuit, the second signal line is configured to transmit a second driving signal to the second pixel circuit and the third pixel circuit, so that the second pixel circuit drives the second light-emitting element to emit light and the third pixel circuit drives the third light-emitting element to emit light; and
the third signal line is in the second display region and extends along the first direction, and the third signal line is floating.

* * * * *